United States Patent
Hitonishi et al.

(10) Patent No.: US 8,027,654 B2
(45) Date of Patent: Sep. 27, 2011

(54) DIGITAL BROADCASTING RECEIVING APPARATUS

(75) Inventors: Jun Hitonishi, Osaka (JP); Akira Aochi, Osaka (JP)

(73) Assignee: Funai Electric Co., Ltd., Osaka (JP)

(*) Notice: Subject to any disclaimer, the term of this patent is extended or adjusted under 35 U.S.C. 154(b) by 891 days.

(21) Appl. No.: 12/068,947

(22) Filed: Feb. 13, 2008

(65) Prior Publication Data

US 2008/0198272 A1    Aug. 21, 2008

(30) Foreign Application Priority Data

Feb. 15, 2007   (JP) ................... 2007-034852

(51) Int. Cl.
*H04B 1/18*   (2006.01)
*H04N 5/50*   (2006.01)

(52) U.S. Cl. .............. 455/180.3; 455/188.1; 348/731

(58) Field of Classification Search ............ 455/180.2, 455/180.3, 260, 333, 150.1, 188.1, 188.2, 455/191.1; 375/316, 373; 348/725, E5.097, 348/731; 725/38, 68

See application file for complete search history.

(56) References Cited

U.S. PATENT DOCUMENTS 6,573,949 B1 *   6/2003   Yamamoto ............. 348/731
6,724,440 B1 *   4/2004   Suan et al. ............ 455/260

FOREIGN PATENT DOCUMENTS

| JP | 2000-299823 | 10/2000 |
| WO | WO 01/22583 A2 | 3/2001 |
| WO | WO 01/97512 A2 | 12/2001 |

* cited by examiner

*Primary Examiner* — Quochien B Vuong
(74) *Attorney, Agent, or Firm* — Morgan, Lewis & Bockius LLP

(57) ABSTRACT

When a power source of a digital broadcasting receiving apparatus is turned on, a microprocessor executes reading of a Read Data with specifying a Read Slave Address which is set by applying a prescribed electrical potential to an Address Select (AS) terminal, if the microprocessor confirms that an A/D converter (ADC) bit which is contained in the Read Data from a Mixer Oscillator PLL (MOP) IC is a ADC bit which is set by applying a prescribed electrical potential to an ADC terminal, the microprocessor transmits a tuning data of a format which corresponds to the MOP IC in which target channel is specified with specifying a Write Slave Address which is set by applying a prescribed electrical potential to the AS terminal.

9 Claims, 21 Drawing Sheets

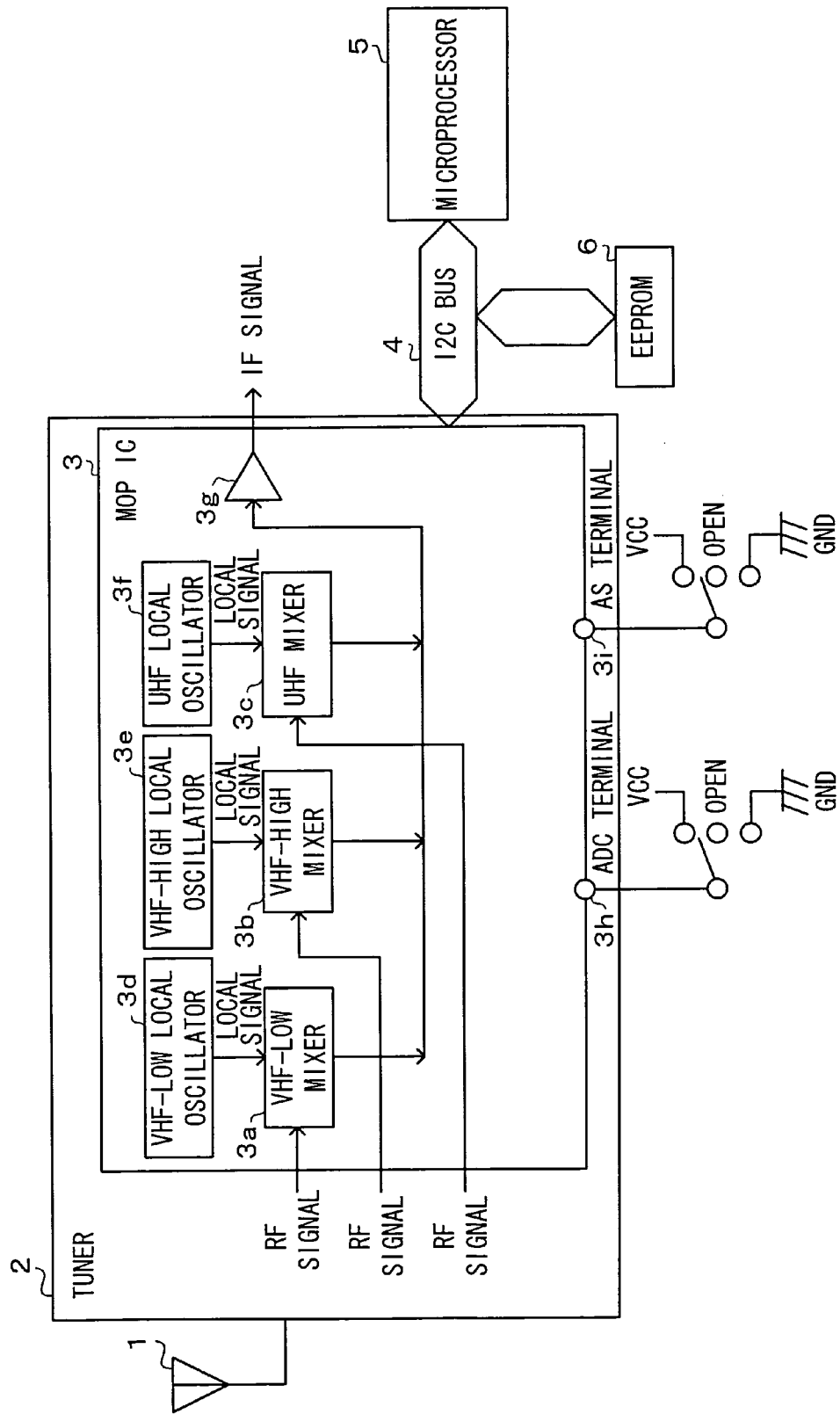

FIG.2A

|  | ADC TERMINAL ELECTRICAL POTENTIAL | ADC BIT |
|---|---|---|
| TUNER MADE BY A COMPANY | VCC | 100 |
| TUNER MADE BY B COMPANY | OPEN | 111 |
| TUNER MADE BY C COMPANY | GND | 000 |

FIG.2B

|  | AS TERMINAL ELECTRICAL POTENTIAL | WRITE SLAVE ADDRESS | READ SLAVE ADDRESS |
|---|---|---|---|
| TUNER MADE BY A COMPANY | OPEN | C2h | C3h |
| TUNER MADE BY B COMPANY | VCC | C6h | C7h |
| TUNER MADE BY C COMPANY | GND | C0h | C1h |

DIGITAL BROADCASTING RECEIVING APPARATUS

This application is based on Japanese Patent Application No. 2007-034852 filed on Feb. 15, 2007, and the contents of which are hereby incorporated by reference.

BACKGROUND OF THE INVENTION

1. Field of the Invention

The present invention relates to a digital broadcasting receiving apparatus.

2. Description of the Related Art

Heretofore in a production line for a digital broadcasting receiving apparatus, it has been performed that a plurality of tuners which are made by a plurality of tuner manufacturers are employed because of cost merit and stable product supply by competition (as for technology where tuners made by different suppliers are used in a same type of broadcasting receiving apparatus, see for example, JP-A-2000-299823). In such situation, a plurality of different tuner driving software are necessary for every tuner made by different supplier because Mixer Oscillator PLL (MOP) ICs which are employed for the tuners by every different tuner supplier are different and format of tuning data which are used are different. As a result, in a conventional digital broadcasting receiving apparatus production line a tuner and a microprocessor in which a plurality of tuner driving software are built in are attached on a circuit board in an assembly step, and information that the attached tuner is made by which tuner manufacturer is controlled for every product. The controlled information is reported to a completion check step which is a down stream step, and a worker operates every product in a manufacturer factory mode in the completion check step and selectively set which tuner driving software is driven.

However in the above described and conventional digital broadcasting receiving apparatus it causes a cost problem because of management costs as above described which are required for the control in the assembly step and for matching control between the assembly step and the completion check step, and operating cost for the worker. Further, it causes also a problem that there is possibility of miss setting by the worker.

In addition it causes also a problem that after the product is delivered in market when trouble is caused and the tuner is replaced by a serviceman to a new one that is made by a different tuner supplier from the original, the serviceman needs a high level skill because it is necessary to operate the manufacturer factory mode to select and to set the tuner driving software.

SUMMARY OF THE INVENTION

It is an object of the present invention to provide a digital broadcasting receiving apparatus which can reduce cost by dispensing the operating cost and the management cost as conventionally required.

To attain the above described object, a digital broadcasting receiving apparatus in accordance with the present invention includes: a tuner which has a Mixer Oscillator PLL (MOP) IC; and a microprocessor which is connected to the MOP IC in communicatable, and the digital broadcasting receiving apparatus is structured as that a prescribed A/D converter (ADC) bit is set in an ADC bit which is contained in a Read Data stored in the MOP IC by applying a prescribed electrical potential to an ADC terminal which is included in the MOP IC, and a prescribed Write Slave Address and a prescribed Read Slave Address are set in the MOP IC by applying a prescribed electrical potential to an Address Select (AS) terminal which is included in the MOP IC; when a power source of the apparatus is turned on, the microprocessor executes reading of a Read Data with specifying the prescribed Read Slave Address; and if the microprocessor confirms that the ADC bit which is contained in the Read Data from the MOP IC is the prescribed ADC bit, the microprocessor transmits a tuning data of a format which corresponds to the MOP IC in which a target channel is specified with specifying the prescribed Write Slave Address.

According to such structure, tuner discrimination can be performed automatically, and the setting operation in the manufacturer factory mode by a worker and the control in the assembly step and matching control between the assembly step and the completion check step which were performed conventionally become not required. As a result, the cost can be reduced because the operating cost and the management cost as the conventional way becomes not required.

Further, the digital broadcasting receiving apparatus in accordance with the present invention has a structure in that the microprocessor executes reading of the Read Data with specifying the prescribed Read Slave Address; and if the microprocessor cannot confirm that the ADC bit which is contained in the Read Data from the MOP IC is the prescribed ADC bit, the microprocessor once again executes reading of the Read Data with specifying the prescribed Read Slave Address in the above described structure. According to such structure, it becomes possible to retry even when the ADC bit cannot be read correctly.

Further, to attain the above described object a digital broadcasting receiving apparatus in accordance with the present invention includes: a tuner which has a Mixer Oscillator PLL (MOP) IC; and a microprocessor which is connected to the MOP IC in communicatable, and the digital broadcasting receiving apparatus is structured as that a prescribed A/D converter (ADC) bit is set in an ADC bit which is contained in a Read Data stored in the MOP IC by applying a prescribed electrical potential to an ADC terminal which is included in the MOP IC, and a prescribed Write Slave Address and a prescribed Read Slave Address are set in the MOP IC by applying a prescribed electrical potential to an Address Select (AS) terminal which is included in the MOP IC; when a power source of the apparatus is turned on, the microprocessor transmits a tuning data of a format which corresponds to the MOP IC in which a prescribed channel is specified with specifying the prescribed Write Slave Address; then the microprocessor executes reading of a Read Data with specifying the prescribed Read Slave Address; and if the microprocessor confirms that a flag which is contained in the Read Data from the MOP IC designates that a frequency of a local signal which is output from a local oscillator that is included in the MOP IC is locked in a frequency which is a prescribed intermediate frequency higher than a frequency that corresponds to the prescribed channel, the microprocessor transmits the tuning data of the format which corresponds to the MOP IC in which target channel is specified with specifying the prescribed Write Slave Address.

According to such structure the tuner discrimination can be also performed automatically and effect as above described can be obtained.

Further, the digital broadcasting receiving apparatus in accordance with the present invention has a structure in that the microprocessor transmits a tuning data of the format which corresponds to the MOP IC in which the prescribed channel is specified with specifying the prescribed Write Slave Address; then the microprocessor executes reading of the Read Data with specifying the prescribed Read Slave Address; and if the microprocessor cannot confirm that the flag which is contained in the Read Data from the MOP IC designates that the frequency of the local signal which is output from the local oscillator that is included in the MOP IC is locked in the frequency which is the prescribed intermediate frequency higher than the frequency that corresponds to the prescribed channel, the microprocessor once again transmits the tuning data of the format which corresponds to the MOP IC in which the prescribed channel is specified with specifying the prescribed Write Slave Address in the above described structure. According to such structure, it becomes possible to retry even when the flag cannot be read correctly.

Further, the digital broadcasting receiving apparatus in accordance with the present invention has a structure in that the microprocessor executes reading of the Read Data with specifying the prescribed Read Slave Address; and if the microprocessor confirms that the flag which is contained in the Read Data from the MOP IC is an initial value that is set when the power source of the apparatus is turned on, the microprocessor transmits the tuning data of the format which corresponds to the MOP IC in which the prescribed channel is specified with specifying the prescribed Write Slave Address in the above described structure.

Further, the digital broadcasting receiving apparatus in accordance with the present invention has a structure in that the microprocessor executes reading of the Read Data with specifying the prescribed Read Slave Address; if the microprocessor confirms that the flag which is contained in the Read Data from the MOP IC is not the initial value that is set when the power source of the apparatus is turned on, the microprocessor transmits a tuning data by which it is impossible for the frequency of the local signal which is output from the local oscillator that is included in the MOP IC to be locked in the frequency which is the prescribed intermediate frequency higher than a specified frequency; then the microprocessor executes reading of the Read Data with specifying the prescribed Read Slave Address; and if the microprocessor confirms that the flag which is contained in the Read Data from the MOP IC is the initial value, the microprocessor transmits the tuning data of the format which corresponds to the MOP IC in which the prescribed channel is specified with specifying the prescribed Write Slave Address in the above described structure.

Further, to attain the above described object a digital broadcasting receiving apparatus in accordance with the present invention includes: a tuner which has a Mixer Oscillator PLL (MOP) IC; and a microprocessor which is connected to the MOP IC in communicatable, and the digital broadcasting receiving apparatus is structured as that a prescribed A/D converter (ADC) bit is set in an ADC bit which is contained in a Read Data stored in the MOP IC by applying a prescribed electrical potential to an ADC terminal which is included in the MOP IC, and a prescribed Write Slave Address and a prescribed Read Slave Address are set in the MOP IC by applying a prescribed electrical potential to an Address Select (AS) terminal which is included in the MOP IC; when a power source of the apparatus is turned on, the microprocessor transmits a tuning data of a format which corresponds to the MOP IC in which a prescribed channel is specified with specifying the prescribed Write Slave Address; then if the microprocessor confirms that "Acknowledge" signal is returned from the MOP IC, the microprocessor transmits the tuning data of the format which corresponds to the MOP IC in which a target channel is specified with specifying the prescribed Write Slave Address.

According to such structure the tuner discrimination can be also performed automatically and effect as above described can be obtained.

Further, the digital broadcasting receiving apparatus in accordance with the present invention has a structure in that the microprocessor transmits the tuning data of the format which corresponds to the MOP IC in which the prescribed channel is specified with specifying the prescribed Write Slave Address; then if the microprocessor cannot confirm that the "Acknowledge" signal is returned from the MOP IC, the microprocessor once again transmits the tuning data of the format which corresponds to the MOP IC in which the prescribed channel is specified with specifying the prescribed Write Slave Address in the above described structure. According to such structure, it becomes possible to retry even when the MOP IC fails to receive the tuning data by any reason.

BRIEF DESCRIPTION OF THE DRAWINGS

FIG. 1 is a schematic block diagram of a digital broadcasting receiving apparatus in accordance with the present invention;

FIG. 2A is a table to show electrical potentials which are applied to an ADC terminal and ADC bits which are set for every tuner made by different supplier;

FIG. 2B is a table to show electrical potentials which are applied to an AS terminal, and write slave address and read slave address which are set for every tuner made by different supplier;

DESCRIPTION OF THE PREFERRED EMBODIMENTS

First Embodiment

Figure 3:
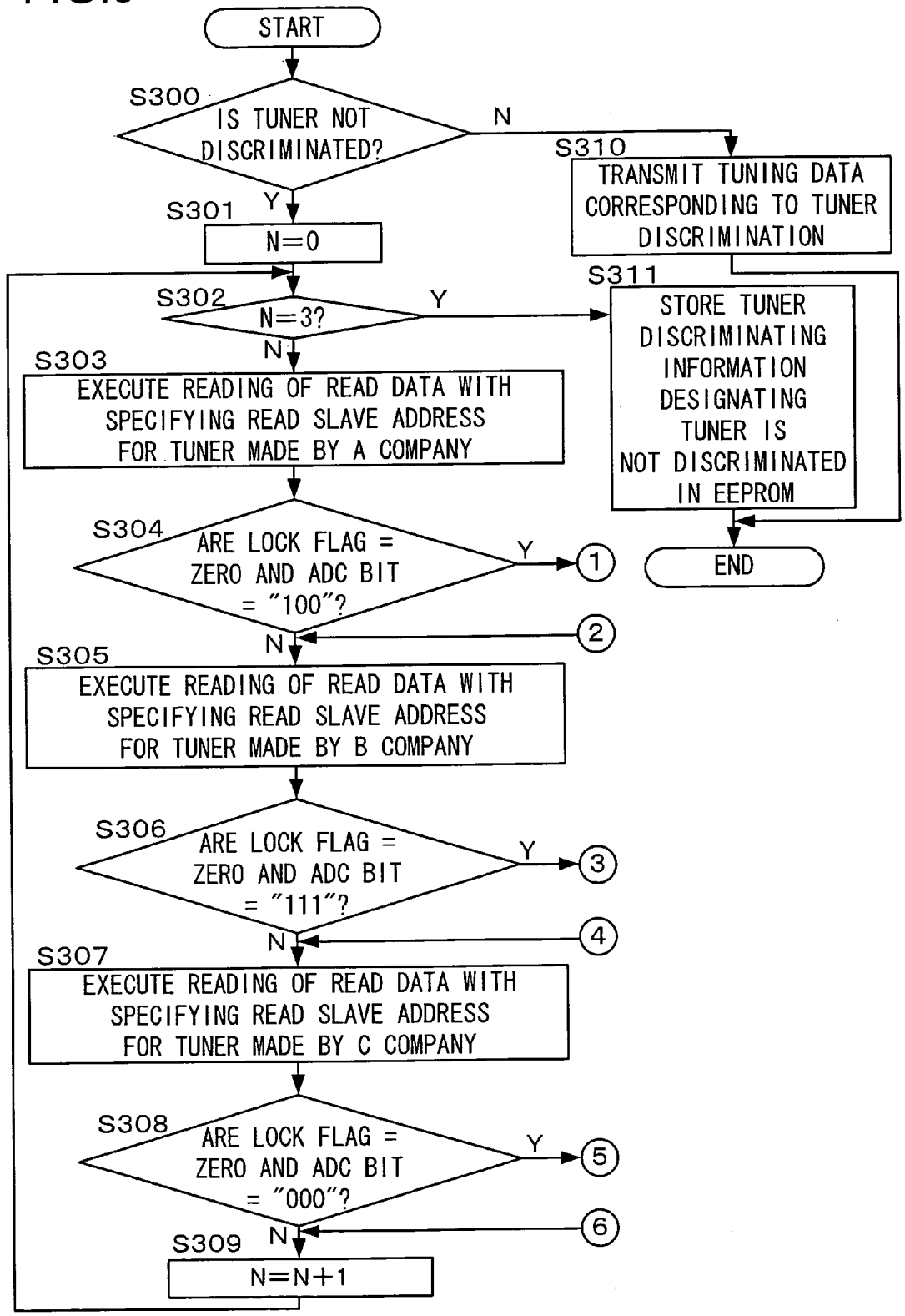
FIG. 3 is a flow chart which relates to a tuner discriminating operation in a first embodiment of the present invention.

Hereinafter a first embodiment in accordance with the present invention will be described with reference to drawings.

In FIG. 1 a schematic block diagram of a digital broadcasting receiving apparatus according to the first embodiment is shown. This digital broadcasting receiving apparatus includes a tuner 2 which has a Mixer Oscillator PLL (MOP) IC 3, an I2C Bus 4, a microprocessor 5, and an EEPROM 6. The MOP IC 3 has a VHF-Low mixer 3a, a VHF-High mixer 3b, a UHF mixer 3c, a VHF-Low local oscillator 3d, a VHF-High local oscillator 3e, a UHF local oscillator 3f, an intermediate frequency amplifier 3g, an A/D converter (ADC) terminal 3h and an Address Select (AS) terminal 3i. There are three kinds of tuners 2 which are made by A company, B company, and C company. The MOP ICs 3 which are used are different for every tuner manufacturer and format of tuning data which are used in the respective MOP ICs 3 are also different.

The tuner 2 extracts RF signal which has frequency designated by the tuning data output from the microprocessor 5 from the RF signal which is converted from broadcasted airwave by an antenna 1. The extracted RF signal is input to any of the VHF-Low mixer 3a, the VHF-High mixer 3b, or the UHF mixer 3c which is included in the MOP IC 3 according to frequency band to that the RF signal belongs.

The VHF-Low local oscillator 3d, the VHF-High local oscillator 3e, or the UHF local oscillator 3f which is included in the MOP IC 3, outputs a local signal which is locked in a frequency that is a prescribed intermediate frequency higher than a frequency which is designated by the tuning data output from the microprocessor 5 to the VHF-Low mixer 3a, the VHF-High mixer 3b, or the UHF mixer 3c by PLL control. Further, the local oscillator corresponding to a frequency band which is designated by the tuning data output from the microprocessor 5 is driven.

The VHF-Low mixer 3a, the VHF-High mixer 3b, or the UHF mixer 3c mixes the input RF signal and an input local signal, and generates an intermediate frequency signal to output to the intermediate frequency amplifier 3g. The intermediate frequency amplifier 3g amplifies the input intermediate frequency signal to output to external of the tuner 2.

In case where the digital broadcasting receiving apparatus in accordance with the present invention is a television, for example, a digital demodulating portion, a data separating portion, a MPEG decoder, and a display portion (all of them not shown) are further set up in down stream side of the intermediate frequency amplifier 3g. The intermediate frequency signal which is amplified by the intermediate frequency amplifier 3g is digitally demodulated by the digital demodulating portion to extract a transport stream. The data separating portion separates video signal from the transport stream, and the MPEG decoder performs decompression of the separated video signal to output to the display portion, then, a broadcasted program is displayed on the display portion. At this point the present invention can be applied not only to the television but also to a DVD recorder, a hard disk recorder, a composed apparatus of them, a video cassettes recorder, a set top box, and the like.

To an ADC terminal 3h that is included in the MOP IC 3, electrical potential of Vcc is applied if the tuner 2 is made by the A company, electrical potential of Open is applied if the tuner 2 is made by the B company, or electrical potential of ground is applied if the tuner 2 is made by the C company, as shown in FIG. 2A. Depending on the electrical potential which is applied to the ADC terminal 3h, ADC bit of three bits that is contained in a Read Data in the MOP IC 3 is set differently, the ADC bit is set "100" if the electrical potential applied to the ADC terminal 3h is Vcc, the ADC bit is set "111" if the electrical potential applied to the ADC terminal 3h is Open, or the ADC bit is set "000" if the electrical potential applied to the ADC terminal 3h is ground as shown in FIG. 2A.

Further, to an AS terminal 3i that is included in the MOP IC 3, electrical potential of Open is applied if the tuner 2 is made by the A company, electrical potential of Vcc is applied if the tuner 2 is made by the B company, or electrical potential of ground is applied if the tuner 2 is made by the C company, as shown in FIG. 2B. Depending on the electrical potential which is applied to the AS terminal 3i, Write slave address and Read slave address of the MOP IC 3 are set differently. The Write slave address is set "C2h" (h means hexadecimal number) and the Read slave address is set "C3h" if the electrical potential applied to the AS terminal 3i is Open, the Write slave address is set "C6h" and the Read slave address is set "C7h" if the electrical potential applied to the AS terminal 3i is Vcc, or the Write slave address is set "C0h" and the Read slave address is set "C1h" if the electrical potential applied to the AS terminal 3i is ground as shown in FIG. 2B.

The MOP IC 3 is connected to the microprocessor 5 in communicatable by I2C Bus 4 and an EEPROM 6 which is a nonvolatile memory is also connected to the microprocessor 5 in communicable by I2C Bus 4. The tuner driving software which is stored in the microprocessor 5 is common although the tuner 2 is made by the A company, the B company, or the C company.

When a power source of the digital broadcasting receiving apparatus according to the first embodiment which is structured as above described, is turned on, and the tuner driving software which is stored in the microprocessor 5 is executed, a flowchart shown in FIG. 3 is started.

First in step S300, the microprocessor 5 refers to tuner discriminating information which is stored in the EEPROM 6. There are four kinds of the tuner discriminating information which designate a tuner made by the A company, a tuner made by the B company, a tuner made by the C company, and a tuner which is not discriminated, and when the digital broadcasting receiving apparatus is shipped from a factory the tuner discriminating information which designates a tuner which is not discriminated is stored in the EEPROM 6. If the microprocessor 5 confirms that the tuner discriminating information designates the tuner is not discriminated in step S300 (Y in step S300), the flow proceeds to step S 301.

In step S301, the microprocessor 5 makes a variable N zero (0). Then in step S302, the microprocessor 5 judges whether the variable N is three (3) or not, and if the variable N is not three (N in step S302), the flow proceeds to step S303.

In step S303 the microprocessor 5 executes reading of the Read Data with specifying a Read Slave Address which is set for a tuner made by the A company ("C3h" (FIG. 2B)).

Figure 4A:
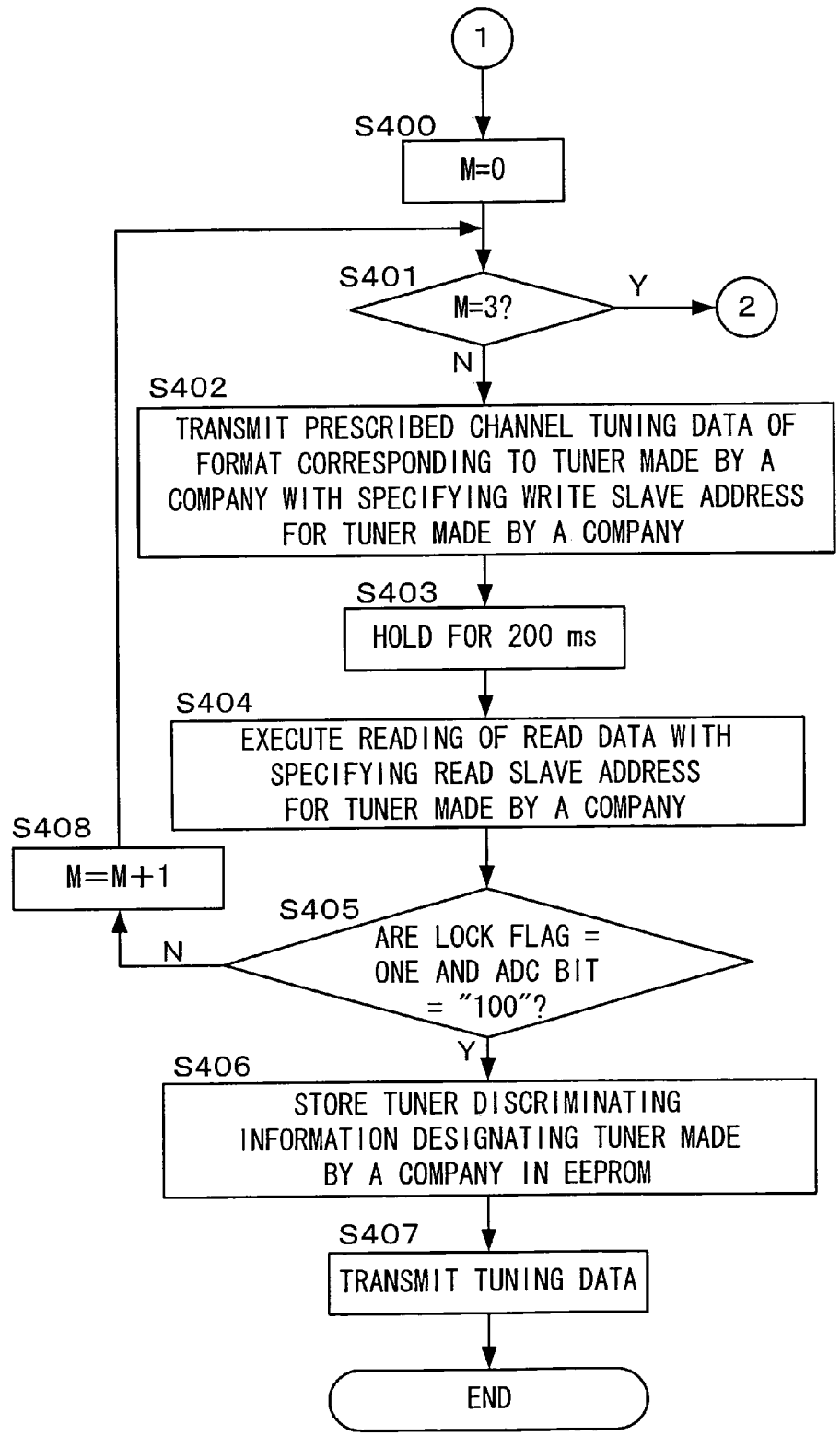
FIG. 4A is a flow chart which relates to the tuner discriminating operation in the first embodiment of the present invention.

Then in step S304, if the microprocessor 5 confirms that a lock flag which is contained in the Read Data from the MOP IC 3 is zero (0) and the ADC bit which is contained in the Read Data is "100" (it corresponds to a tuner made by the A company (FIG. 2A)) (Y in step S304), the microprocessor 5 judges that there is high possibility that the tuner 2 is made by the A company, and the flow proceeds to step S400 in FIG. 4A.

At this point, the lock flag is contained in the Read Data stored in the MOP IC 3, and when the power source of the digital broadcasting receiving apparatus is turned on the lock flag is set to zero (0) as a default value. When the MOP IC 3 receives the tuning data from the microprocessor 5, and frequency of the local signal which is output from any local oscillator among the VHF-Low local oscillator 3d, the VHF-High local oscillator 3e, and the UHF local oscillator 3f that corresponds to frequency band designated by the tuning data is locked by PLL control in a frequency which is a prescribed intermediate frequency higher than a frequency designated by the above described tuning data, the lock flag is set to one (1). At this point if the frequency locking operation as above described cannot be performed even when the MOP IC 3 receives a tuning data from the microprocessor 5, the lock flag is set to zero (0).

In step S400 in FIG. 4A, the microprocessor 5 makes a variable M zero (0). Then, in step S401, the microprocessor 5 judges whether the variable M is three (3) or not, and if the variable M is not three (N in step S401), the flow proceeds to step S402.

In step S402, the microprocessor 5 transmits the tuning data of a format which corresponds to the MOP IC 3 that is used for the tuner made by the A company in which frequency band and frequency that correspond to a prescribed channel are designated with specifying a Write Slave Address which is set for the tuner made by the A company ("C2h" (FIG. 2B)).

Then in step S403 the microprocessor 5 is held for 200 ms, then in step S404 the microprocessor 5 executes reading of the Read Data with specifying the Read Slave Address which is set for the tuner made by the A company ("C3h" (FIG. 2B))

Then in step S405, if the microprocessor 5 confirms that the lock flag which is contained in the Read Data from the MOP IC 3 is one (1) and the ADC bit which is contained in the Read Data is "100" (it corresponds to a tuner made by the A company (FIG. 2A)) (Y in step S405), the microprocessor 5 judges that the tuner 2 is made by the A company, and in step S406 the microprocessor 5 makes the EEPROM 6 store the tuner discriminating information which designates a tuner made by the A company. Then in step S407, the microprocessor 5 transmits the tuning data of the format which corresponds to the MOP IC 3 that is used for the tuner made by the A company in which the frequency band and the frequency that correspond to a target channel are designated with specifying a Write Slave Address which is set for a tuner made by the A company ("C2h" (FIG. 2B)), then operation of the flow is terminated.

At this point in step S405, if the microprocessor 5 cannot confirm that the lock flag which is contained in the Read Data from the MOP IC 3 is one (1) and the ADC bit which is contained in the Read Data is "100" (N in step S405), the flow proceeds to step S408 and the microprocessor 5 increments the variable M by one (1), then the flow returns to step S401.

In step S401 when the microprocessor 5 judges that the variable M is three (3) (Y in step S401), or in step S304 (FIG. 3) if the microprocessor 5 cannot confirm that the lock flag which is contained in the Read Data from the MOP IC 3 is zero (0) and the ADC bit which is contained in the Read Data is "100" (N in step S304), the flow proceeds to step S305.

In step S305 the microprocessor 5 executes reading of the Read Data with specifying the Read Slave Address which is set for a tuner made by the B company ("C7h" (FIG. 2B)).

Figure 4B:
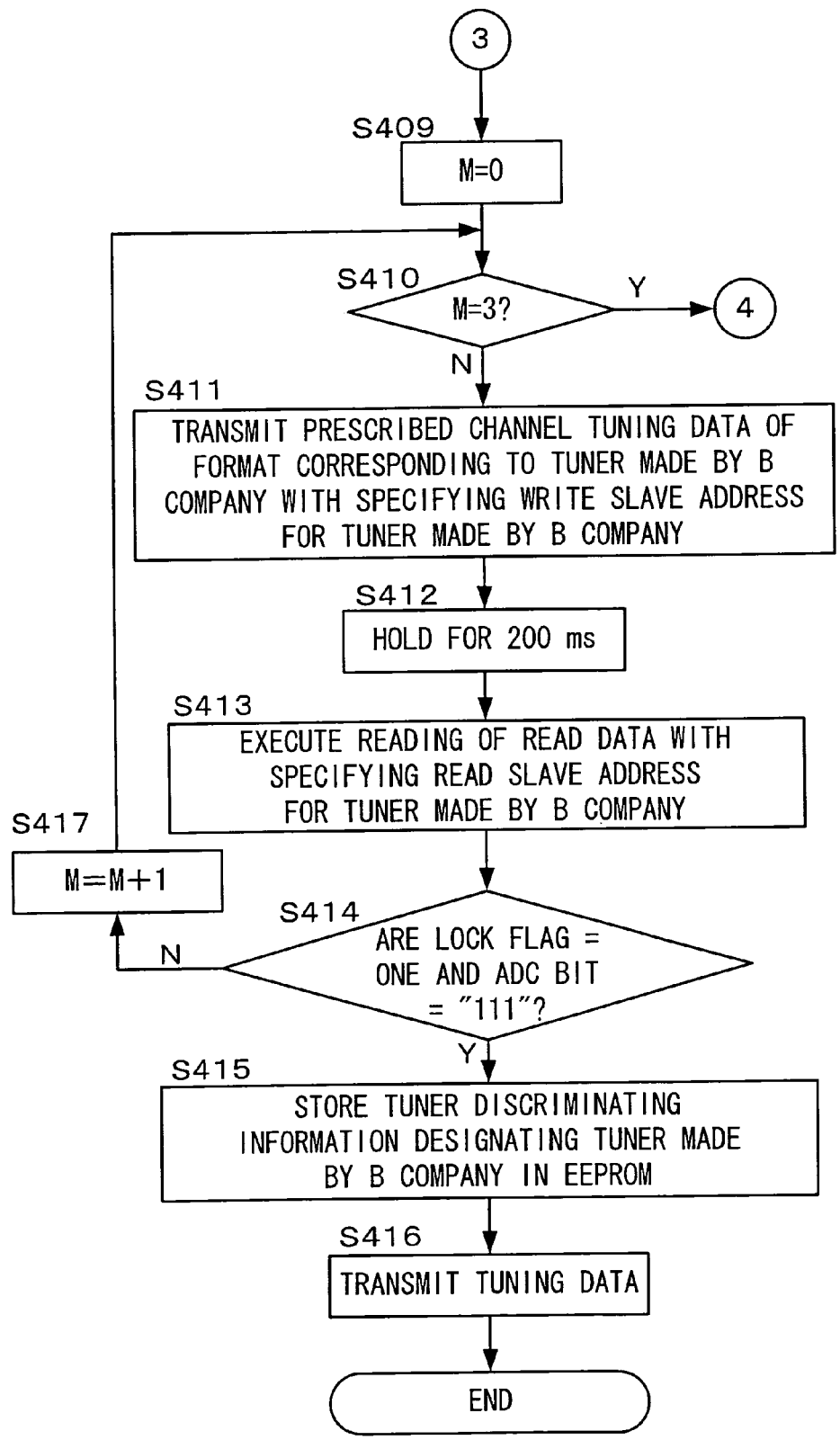
FIG. 4B is a flow chart which relates to the tuner discriminating operation in the first embodiment of the present invention.

Then in step S306, if the microprocessor 5 confirms that the lock flag which is contained in the Read Data from the MOP IC 3 is zero (0) and the ADC bit which is contained in the Read Data is "111" (it corresponds to a tuner made by the B company (FIG. 2A)) (Y in step S306), the microprocessor 5 judges that there is high possibility the tuner 2 is made by the B company, and the flow proceeds to step S409 in FIG. 4B.

In step S409 in FIG. 4B, the microprocessor 5 makes the variable M zero (0). Then, in step S410, the microprocessor 5 judges whether the variable M is three (3) or not, and if the variable M is not three (N in step S410), the flow proceeds to step S411.

In step S411, the microprocessor 5 transmits the tuning data of the format which corresponds to the MOP IC 3 that is used for the tuner made by the B company in which the frequency band and the frequency that correspond to a prescribed channel are designated with specifying a Write Slave Address which is set for the tuner made by the B company ("C6h" (FIG. 2B)).

Then in step S412 the microprocessor 5 is held for 200 ms, then in step S413 the microprocessor 5 executes reading of the Read Data with specifying the Read Slave Address which is set for the tuner made by the B company ("C7h" (FIG. 2B)).

Then in step S414, if the microprocessor 5 confirms that the lock flag which is contained in the Read Data from the MOP IC 3 is one (1) and the ADC bit which is contained in the Read Data is "111" (it corresponds to a tuner made by the B company (FIG. 2A)) (Y in step S414), the microprocessor 5 judges that the tuner 2 is made by the B company, and in step S415 the microprocessor 5 makes the EEPROM 6 store the tuner discriminating information which designates a tuner made by the B company. Then in step S416, the microprocessor 5 transmits the tuning data of the format which corresponds to the MOP IC 3 that is used for the tuner made by the B company in which the frequency band and the frequency that correspond to the target channel are designated with specifying a Write Slave Address which is set for a tuner made by the B company ("C6h" (FIG. 2B)), then operation of the flow is terminated.

At this point in step S414, if the microprocessor 5 cannot confirm that the lock flag which is contained in the Read Data from the MOP IC 3 is one (1) and the ADC bit which is contained in the Read Data is "111" (N in step S414), the flow proceeds to step S417 and the microprocessor 5 increments the variable M by one (1), then the flow returns to step S410.

In step S410 when the microprocessor 5 judges that the variable M is three (3) (Y in step S410), or in step S306 (FIG. 3) if the microprocessor 5 cannot confirm that the lock flag which is contained in the Read Data from the MOP IC 3 is zero (0) and the ADC bit which is contained in the Read Data is "111" (N in step S306), the flow proceeds to step S307.

In step S307 the microprocessor 5 executes reading of the Read Data with specifying the Read Slave Address which is set for a tuner made by the C company ("C1h" (FIG. 2B)).

Figure 4C:
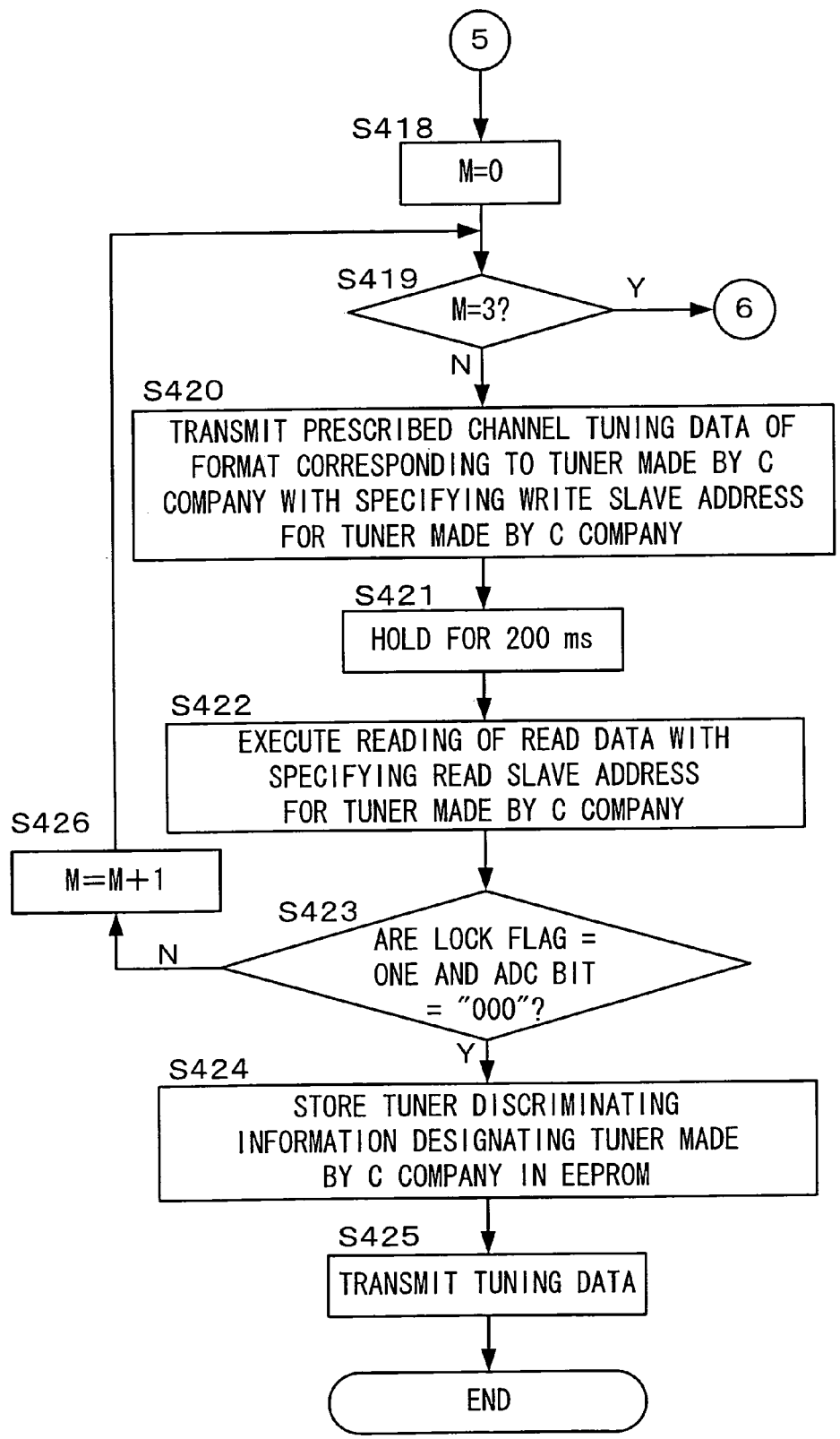
FIG. 4C is a flow chart which relates to the tuner discriminating operation in the first embodiment of the present invention.

Then in step S308, if the microprocessor 5 confirms that the lock flag which is contained in the Read Data from the MOP IC 3 is zero (0) and the ADC bit which is contained in the Read Data is "000" (it corresponds to a tuner made by the C company (FIG. 2A)) (Y in step S308), the microprocessor 5 judges that there is high possibility the tuner 2 is made by the C company, and the flow proceeds to step S418 in FIG. 4C.

In step S418 in FIG. 4C, the microprocessor 5 makes the variable M zero (0). Then, in step S419, the microprocessor 5 judges whether the variable M is three (3) or not, and if the variable M is not three (N in step S419), the flow proceeds to step S420.

In step S420, the microprocessor 5 transmits the tuning data of the format which corresponds to the MOP IC 3 that is used for the tuner made by the C company in which the frequency band and the frequency that correspond to a prescribed channel are designated with specifying a Write Slave Address which is set for the tuner made by the C company ("C0h" (FIG. 2B)).

Then in step S421 the microprocessor 5 is held for 200 ms, then in step S422 the microprocessor 5 executes reading of the Read Data with specifying the Read Slave Address which is set for the tuner made by the C company ("C1h" (FIG. 2B)).

Then in step S423, if the microprocessor 5 confirms that the lock flag which is contained in the Read Data from the MOP IC 3 is one (1) and the ADC bit which is contained in the Read Data is "000" (it corresponds to a tuner made by the C company (FIG. 2A)) (Y in step S423), the microprocessor 5 judges that the tuner 2 is made by the C company, and in step S424 the microprocessor 5 makes the EEPROM 6 store the tuner discriminating information which designates a tuner made by the C company. Then in step S425, the microprocessor 5 transmits the tuning data of the format which corresponds to the MOP IC 3 that is used for the tuner made by the C company in which the frequency band and the frequency that correspond to the target channel are designated with specifying a Write Slave Address which is set for a tuner made by the C company ("C0h" (FIG. 2B)), then operation of the flow is terminated.

At this point in step S423, if the microprocessor 5 cannot confirm that the lock flag which is contained in the Read Data from the MOP IC 3 is one (1) and the ADC bit which is contained in the Read Data is "000" (N in step S423), the flow proceeds to step S426 and the microprocessor 5 increments the variable M by one (1), then the flow returns to step S419.

In step S419 when the microprocessor 5 judges that the variable M is three (3) (Y in step S419), or in step S308 (FIG. 3) if the microprocessor 5 cannot confirm that the lock flag which is contained in the Read Data from the MOP IC 3 is zero (0) and the ADC bit which is contained in the Read Data is "000" (N in step S308), the flow proceeds to step S309. In step S309 the microprocessor 5 increments the variable N by one (1), then the flow returns to step S302.

In step S302 if the microprocessor 5 judges that the variable N is three (3) (Y in step S302), the flow proceeds to step S311, and the microprocessor 5 makes the EEPROM 6 store the tuner discriminating information which designates the tuner is not discriminated, then the tuning data is not transmitted anymore.

Further, in step S300 when the microprocessor 5 confirms that the tuner discriminating information designates any one of tuners made by the A company, the B company, or the C company (N in step S300), the flow proceeds to step S310. In step S310 the microprocessor 5 transmits the tuning data of the format which corresponds to the tuner discrimination in which the frequency band and the frequency that correspond to the target channel are designated with specifying the Write Slave Address that corresponds to a tuner discrimination, then operation of the flow is terminated.

According to the above described first embodiment, tuner discrimination can be performed automatically, and the setting operation in the manufacturer factory mode by a worker and the control in the assembly step and matching control between the assembly step and the completion check step which were performed conventionally become not required, therefore, the cost can be reduced. Further, missetting by a worker as the conventional way does not happen. In addition, when a serviceman exchanges a tuner to other manufacture's tuner because of problem after shipping from a factory, high skill for the serviceman is not required because setting operation in the manufacturer factory mode as the conventional way becomes not required.

Second Embodiment

Next a second embodiment in accordance with the present invention will be described with reference to drawings. A structure of the digital broadcasting receiving apparatus according to the second embodiment is similar to the digital broadcasting receiving apparatus according to the first embodiment above described, and only the tuner discriminating operation is different from that of the first embodiment.

Figure 5:
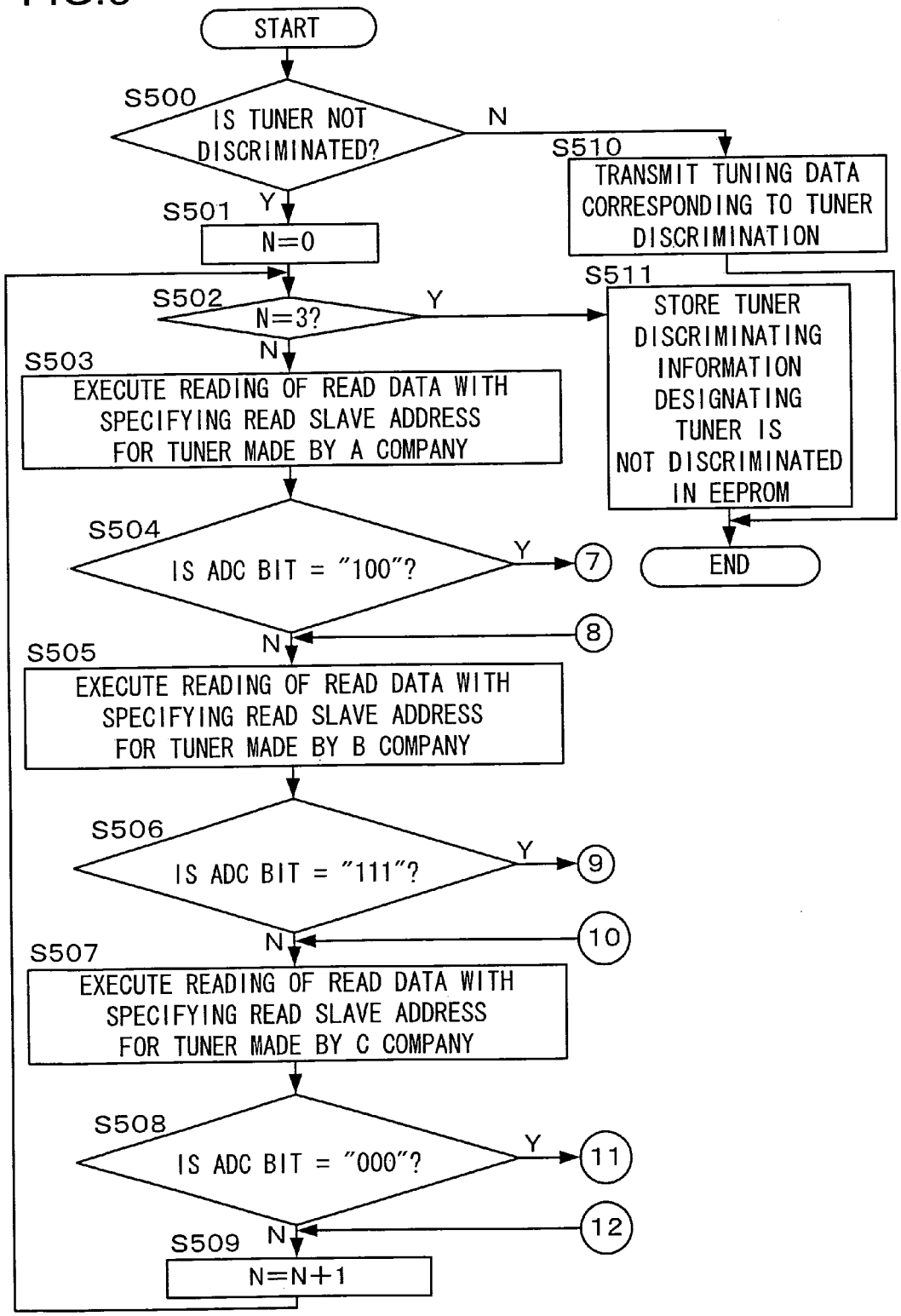
FIG. 5 is a flow chart which relates to a tuner discriminating operation in a second embodiment of the present invention.

When a power source of the digital broadcasting receiving apparatus according to the second embodiment is turned on, and the tuner driving software which is stored in the microprocessor 5 is executed, a flowchart shown in FIG. 5 is started.

First in step S500, the microprocessor 5 refers to tuner discriminating information which is stored in the EEPROM 6. There are four kinds of the tuner discriminating information which designate a tuner made by the A company, a tuner made by the B company, a tuner made by the C company, and a tuner which is not discriminated, and when the digital broadcasting receiving apparatus is shipped from a factory the tuner discriminating information that designates a tuner which is not discriminated is stored in the EEPROM 6. If the microprocessor 5 confirms that the tuner discriminating information designates the tuner is not discriminated in step S500 (Y in step S500), the flow proceeds to step S 501.

In step S501, the microprocessor 5 makes a variable N zero (0). Then in step S502, the microprocessor 5 judges whether the variable N is three (3) or not, and if the variable N is not three (N in step S502), the flow proceeds to step S503.

In step S503 the microprocessor 5 executes reading of a Read Data with specifying a Read Slave Address which is set for a tuner made by the A company ("C3h" (FIG. 2B)).

Figure 6A:
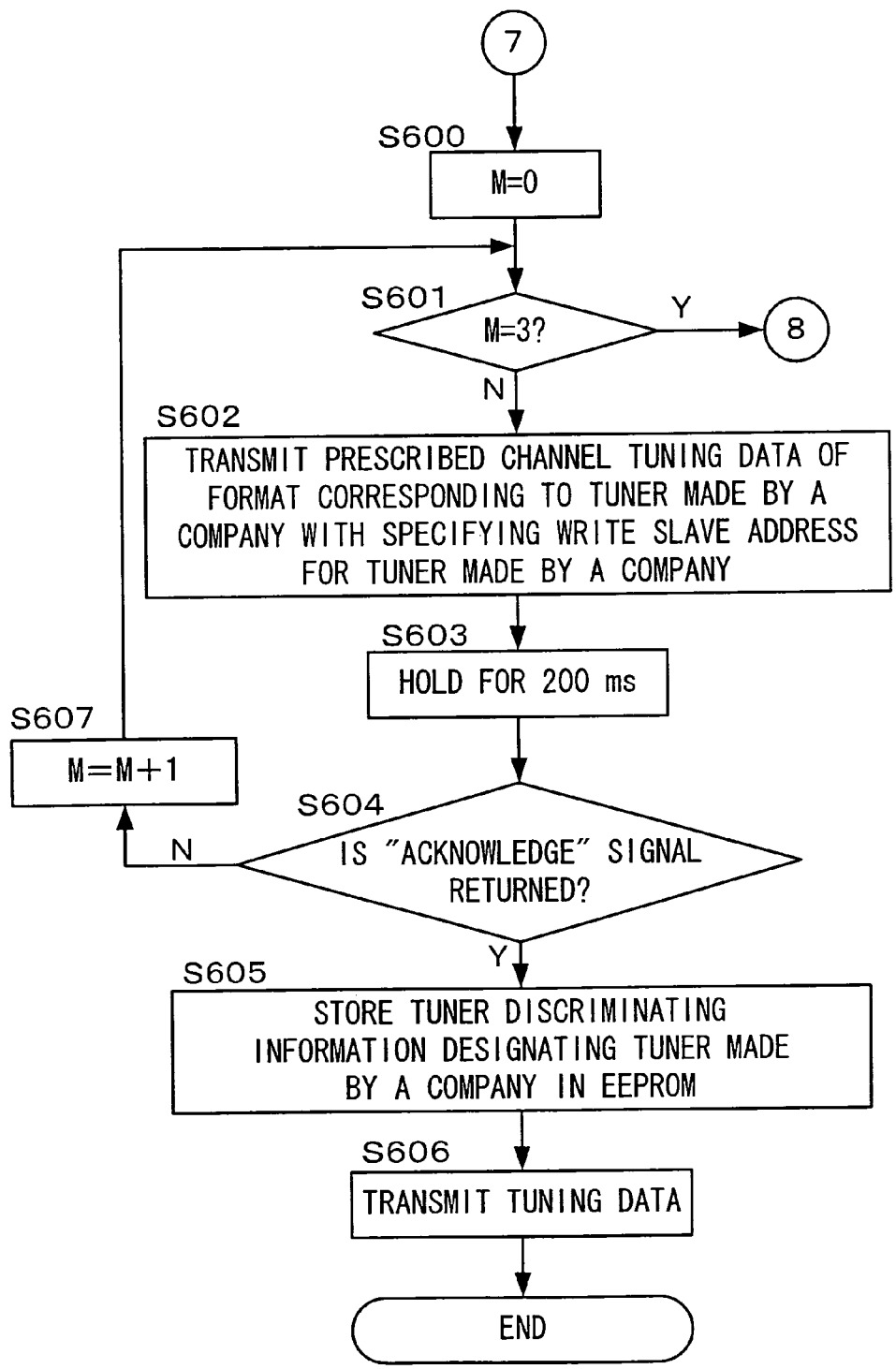
FIG. 6A is a flow chart which relates to the tuner discriminating operation in the second embodiment of the present invention.

Then in step S504, if the microprocessor 5 confirms that an ADC bit which is contained in the Read Data from the MOP IC 3 is "100" (it corresponds to a tuner made by the A company (FIG. 2A)) (Y in step S504), the microprocessor 5 judges that there is high possibility the tuner 2 is made by the A company, and the flow proceeds to step S600 in FIG. 6A.

In step S600, the microprocessor 5 makes a variable M zero (0). Then, in step S601, the microprocessor 5 judges whether the variable M is three (3) or not, and if the variable M is not three (N in step S601), the flow proceeds to step S602.

In step S602, the microprocessor 5 transmits the tuning data of a format which corresponds to the MOP IC 3 that is used for the tuner made by the A company in which frequency band and frequency that correspond to a prescribed channel are designated with specifying a Write Slave Address which is set for the tuner made by the A company ("C2h" (FIG. 2B)).

Then in step S603 the microprocessor 5 is held for 200 ms, then in step S604, if the microprocessor 5 confirms that "Acknowledge" signal is returned from the MOP IC 3 (Y in step S604), the microprocessor 5 judges that the tuner 2 is made by the A company, and the flow proceeds to step S605 the microprocessor 5 makes the EEPROM 6 store a tuner discriminating information which designates a tuner made by the A company. Then in step S606, the microprocessor 5 transmits the tuning data of the format which corresponds to the MOP IC 3 that is used for the tuner made by the A company in which the frequency band and the frequency that correspond to a target channel are designated with specifying the Write Slave Address which is set for a tuner made by the A company ("C2h" (FIG. 2B)), then operation of the flow is terminated.

At this point in step S604, if the microprocessor 5 cannot confirm that the "Acknowledge" signal is returned from the MOP IC 3 (N in step S604), the flow proceeds to step S607 and the microprocessor 5 increments the variable M by one (1), then the flow returns to step S601.

In step S601 when the microprocessor 5 judges that the variable M is three (3) (Y in step S601), or in step S504 (FIG. 5) if the microprocessor 5 cannot confirm that the ADC bit which is contained in the Read Data from the MOP IC 3 is "100" (N in step S504), the flow proceeds to step S505.

In step S505 the microprocessor 5 executes reading of the Read Data with specifying the Read Slave Address which is set for a tuner made by the B company ("C7h" (FIG. 2B)).

Figure 6B:
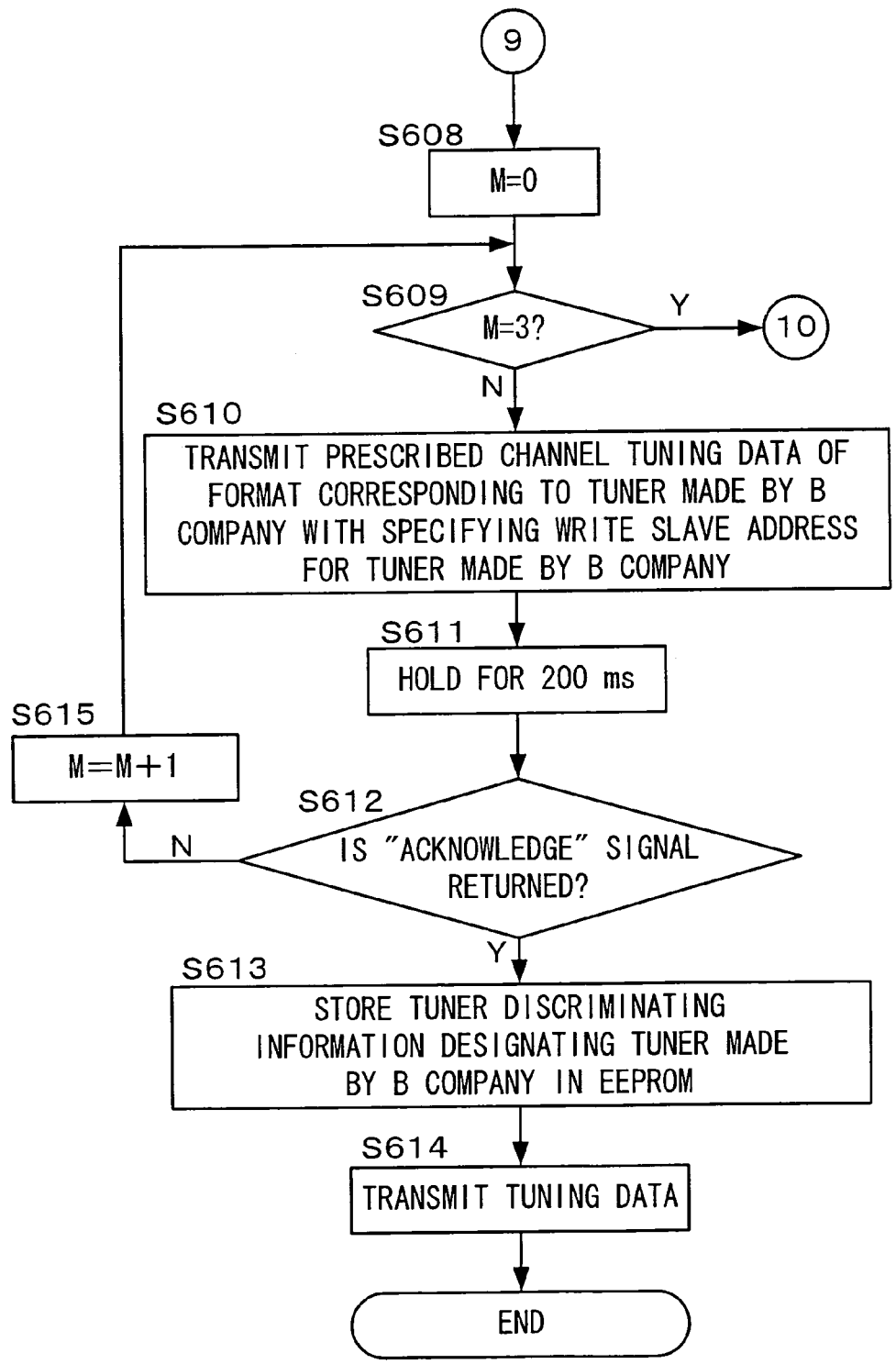
FIG. 6B is a flow chart which relates to the tuner discriminating operation in the second embodiment of the present invention.

Then in step S506, if the microprocessor 5 confirms that the ADC bit which is contained in the Read Data from the MOP IC 3 is "111" (it corresponds to a tuner made by the B company (FIG. 2A)) (Y in step S506), the microprocessor 5 judges that there is high possibility the tuner 2 is made by the B company, and the flow proceeds to step S608 in FIG. 6B.

In step S608 microprocessor 5 makes the variable M zero (0). Then, in step S609, the microprocessor 5 judges whether the variable M is three (3) or not, and if the variable M is not three (N in step S609), the flow proceeds to step S610.

In step S610, the microprocessor 5 transmits the tuning data of the format which corresponds to the MOP IC 3 that is used for the tuner made by the B company in which the frequency band and the frequency that correspond to a prescribed channel are designated with specifying a Write Slave Address which is set for the tuner made by the B company ("C6h" (FIG. 2B)).

Then in step S611 the microprocessor 5 is held for 200 ms, then in step S612, if the microprocessor 5 confirms that the "Acknowledge" signal is returned from the MOP IC 3 (Y in step S612), the microprocessor 5 judges that the tuner 2 is made by the B company, and the flow proceeds to step S613 the microprocessor 5 makes the EEPROM 6 store the tuner discriminating information which designates a tuner made by the B company. Then in step S614, the microprocessor 5 transmits the tuning data of the format which corresponds to the MOP IC 3 that is used for the tuner made by the B company in which the frequency band and the frequency that correspond to the target channel are designated with specifying the Write Slave Address which is set for a tuner made by the B company ("C6h" (FIG. 2B)), then operation of the flow is terminated.

At this point in step S612, if the microprocessor 5 cannot confirm that the "Acknowledge" signal is returned from the MOP IC 3 (N in step S612), the flow proceeds to step S615 and the microprocessor 5 increments the variable M by one (1), then the flow returns to step S609.

In step S609 when the microprocessor 5 judges that the variable M is three (3) (Y in step S609), or in step S506 (FIG. 5) if the microprocessor 5 cannot confirm that the ADC bit which is contained in the Read Data from the MOP IC 3 is "111" (N in step S506), the flow proceeds to step S507.

In step S507 the microprocessor 5 executes reading of the Read Data with specifying the Read Slave Address which is set for a tuner made by the C company ("C1h" (FIG. 2B)).

Figure 6C:
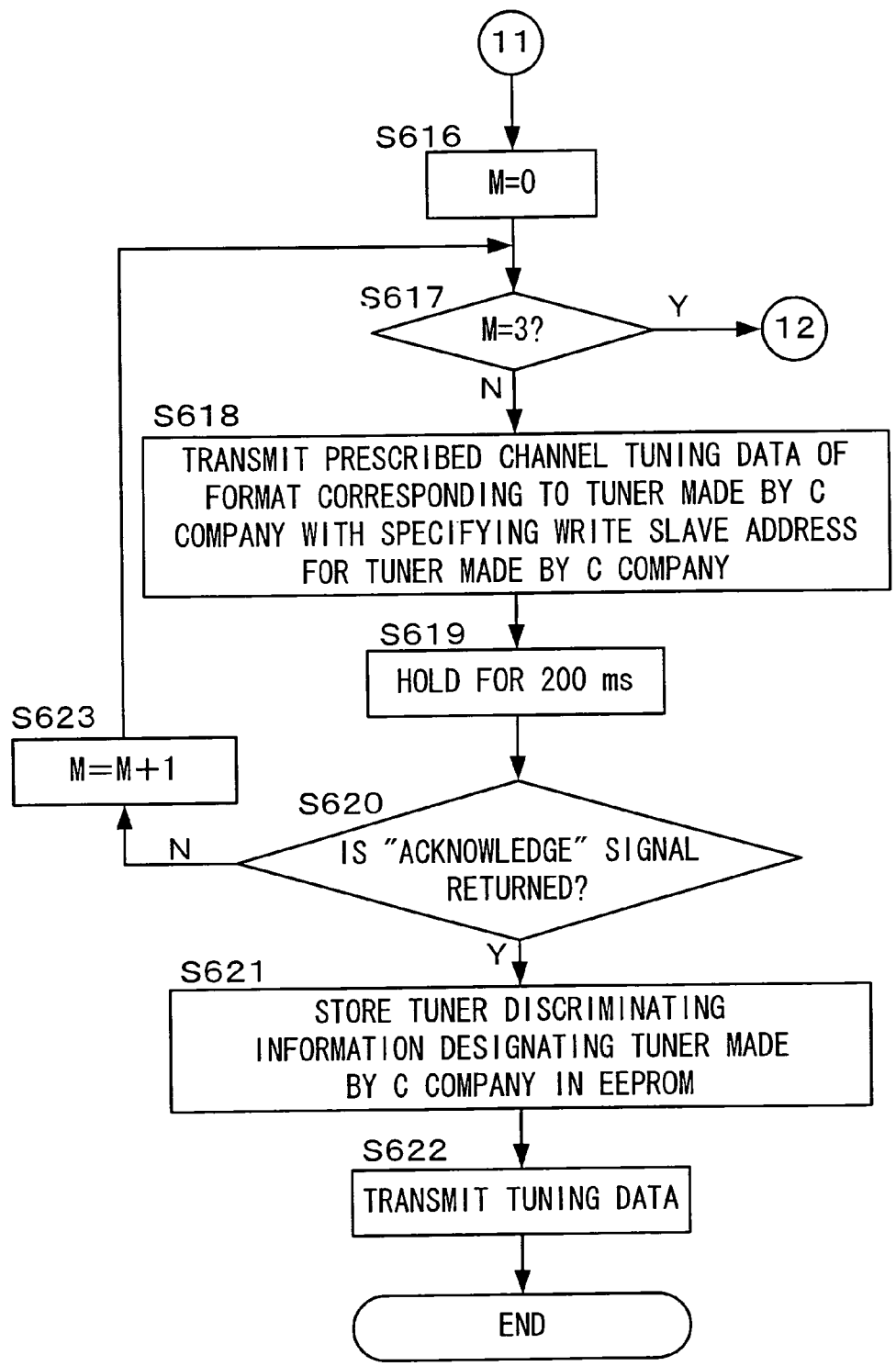
FIG. 6C is a flow chart which relates to the tuner discriminating operation in the second embodiment of the present invention.

Then in step S508, if the microprocessor 5 confirms that the ADC bit which is contained in the Read Data from the MOP IC 3 is "000" (it corresponds to a tuner made by the C company (FIG. 2A)) (Y in step S508), the microprocessor 5 judges that there is high possibility the tuner 2 is made by the C company, and the flow proceeds to step S616 in FIG. 6C.

In step S616 microprocessor 5 makes the variable M zero (0). Then, in step S617, the microprocessor 5 judges whether the variable M is three (3) or not, and if the variable M is not three (N in step S617), the flow proceeds to step S618.

In step S618, the microprocessor 5 transmits the tuning data of the format which corresponds to the MOP IC 3 that is used for the tuner made by the C company in which the frequency band and the frequency that correspond to a prescribed channel are designated with specifying a Write Slave Address which is set for the tuner made by the C company ("C0h" (FIG. 2B)).

Then in step S619 the microprocessor 5 is held for 200 ms, then in step S620, if the microprocessor 5 confirms that the "Acknowledge" signal is returned from the MOP IC 3 (Y in step S620), the microprocessor 5 judges that the tuner 2 is made by the C company, and the flow proceeds to step S621 the microprocessor 5 makes the EEPROM 6 store the tuner discriminating information which designates a tuner made by the C company. Then in step S622, the microprocessor 5 transmits the tuning data of the format which corresponds to the MOP IC 3 that is used for the tuner made by the C company in which the frequency band and the frequency that correspond to the target channel are designated with specifying the Write Slave Address which is set for a tuner made by the C company ("C0h" (FIG. 2B)), then operation of the flow is terminated.

At this point in step S620, if the microprocessor 5 cannot confirm that the "Acknowledge" signal is returned from the MOP IC 3 (N in step S620), the flow proceeds to step S623 and the microprocessor 5 increments the variable M by one (1), then the flow returns to step S617.

In step S617 when the microprocessor 5 judges that the variable M is three (3) (Y in step S617), or in step S508 (FIG. 5) if the microprocessor 5 cannot confirm that the ADC bit which is contained in the Read Data from the MOP IC 3 is "000" (N in step S508), the flow proceeds to step S509. In step S509 the microprocessor 5 increments the variable N by one (1), then the flow returns to step S502.

In step S502 if the microprocessor 5 judges that the variable N is three (3) (Y in step S502), the flow proceeds to step S511, and the microprocessor 5 makes the EEPROM 6 store the tuner discriminating information which designates the tuner is not discriminated, then the tuning data is not transmitted anymore.

Further, in step S500 when the microprocessor 5 confirms that the tuner discriminating information designates any one of tuners made by the A company, the B company, or the C company (N in step S500), the flow proceeds to step S510. In step S510 the microprocessor 5 transmits the tuning data of the format which corresponds to the tuner discrimination in which the frequency band and the frequency that correspond to the target channel are designated with specifying the Write Slave Address that corresponds to the tuner discrimination, then operation of the flow is terminated.

According to this second embodiment that is structured as above described, discrimination of tuner can be performed automatically, and similar effect as the first embodiment above described can be also obtained.

Third Embodiment

Next a third embodiment in accordance with the present invention will be described with reference to drawings. A structure of the digital broadcasting receiving apparatus according to the third embodiment is similar to the digital broadcasting receiving apparatus of the first embodiment above described, and only the tuner discriminating operation is different from that of the first embodiment.

Figure 7A:
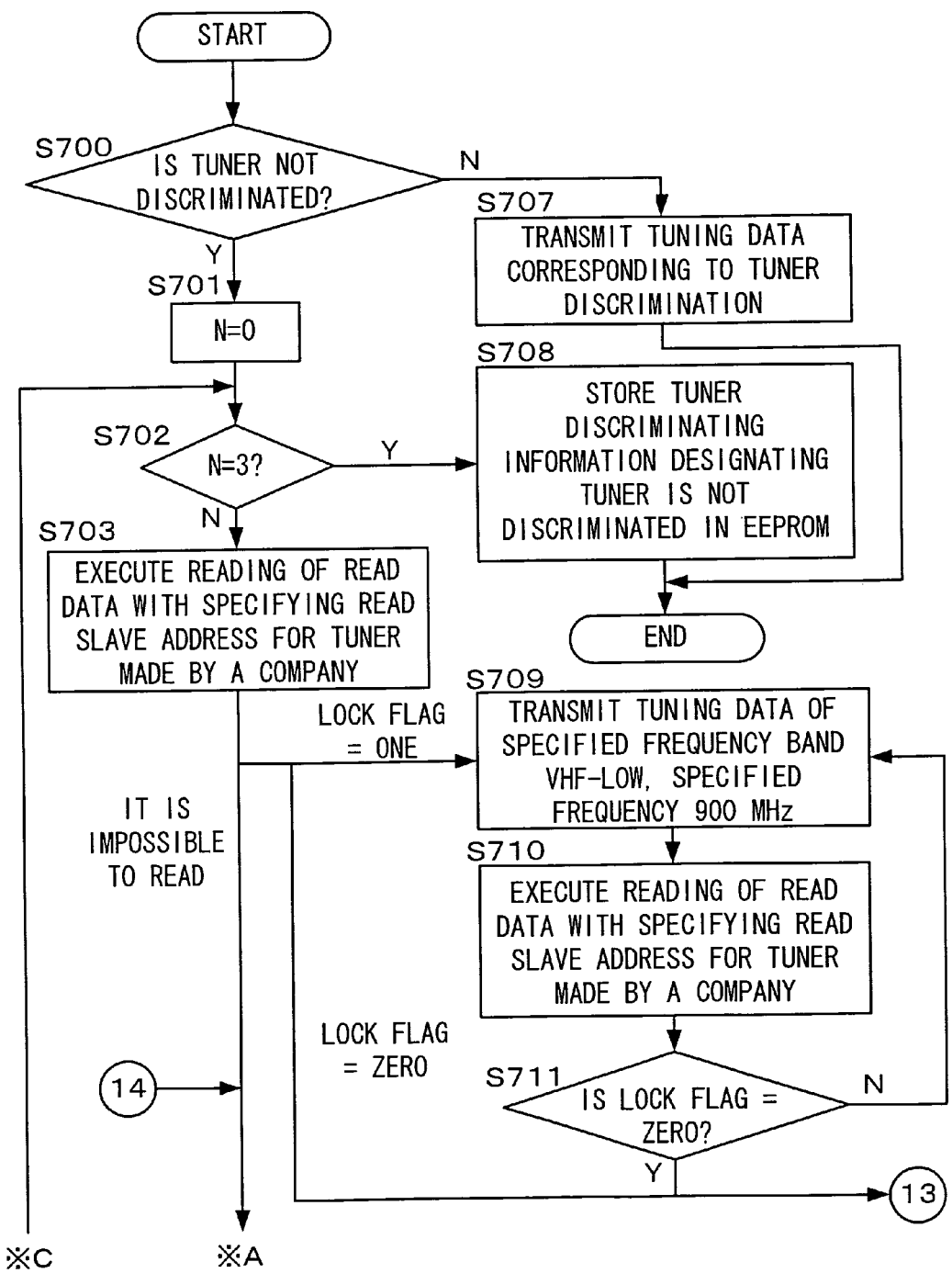
FIG. 7A is a flow chart which relates to a tuner discriminating operation in a third embodiment of the present invention.

When a power source of the digital broadcasting receiving apparatus according to the third embodiment is turned on, and the tuner driving software which is stored in the microprocessor 5 is executed, a flowchart shown in FIG. 7A is started.

First in step S700, the microprocessor 5 refers to tuner discriminating information which is stored in the EEPROM 6. There are four kinds of the tuner discriminating information which designate a tuner made by the A company, a tuner made by the B company, a tuner made by the C company, and a tuner which is not discriminated, and when the digital broadcasting receiving apparatus is shipped from a factory the tuner discriminating information which designates a tuner which is not discriminated is stored in the EEPROM 6. If the microprocessor 5 confirms that the tuner discriminating information designates the tuner is not discriminated in step S700 (Y in step S700), the flow proceeds to step S 701.

In step S701, the microprocessor 5 makes a variable N zero (0). Then in step S702, the microprocessor 5 judges whether the variable N is three (3) or not, and if the variable N is not three (N in step S702), the flow proceeds to step S703.

In step S703 the microprocessor 5 executes reading of a Read Data with specifying a Read Slave Address which is set for a tuner made by the A company ("C3h" (FIG. 2B)).

Figure 8A:
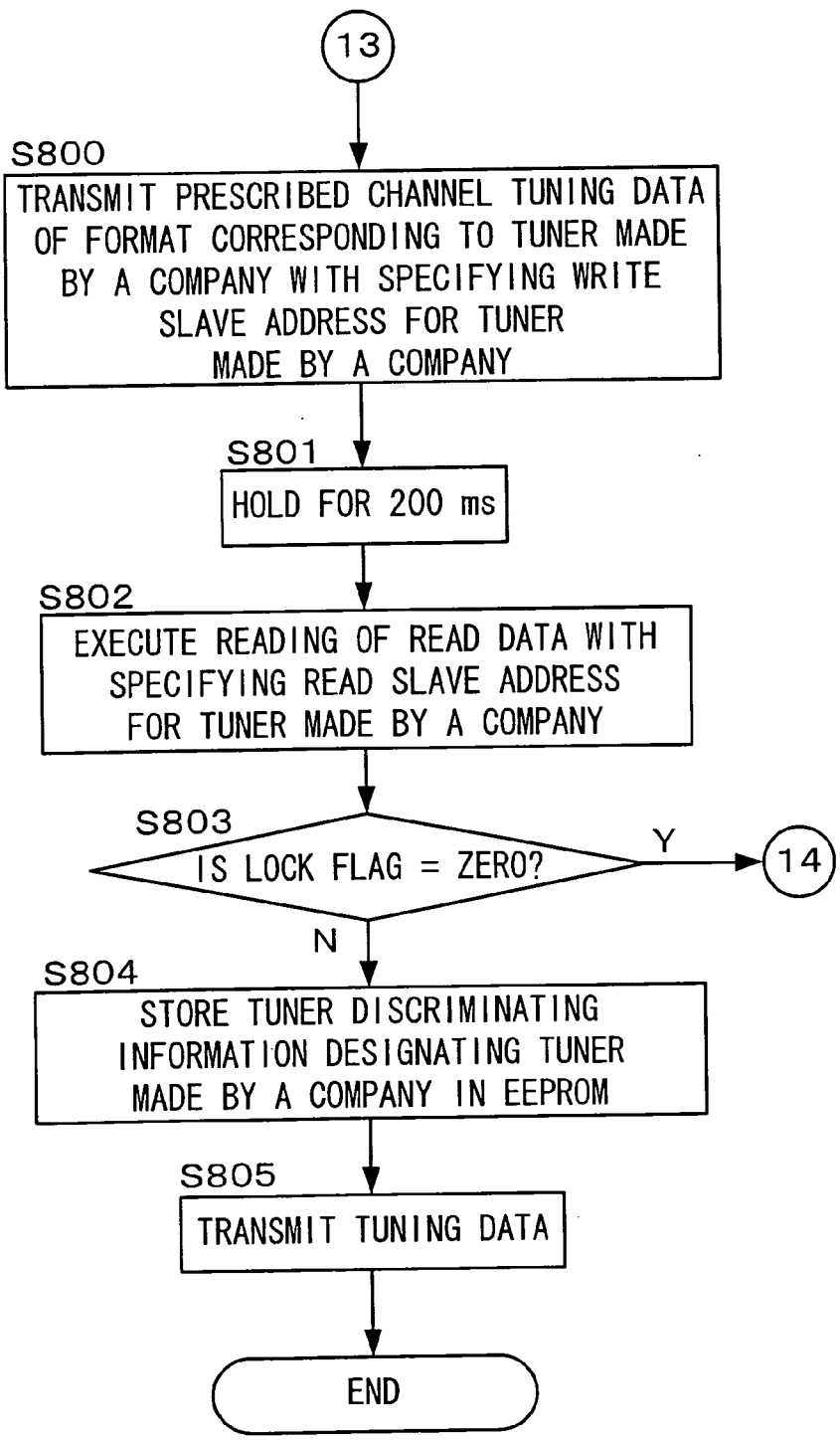
FIG. 8A is a flow chart which relates to the tuner discriminating operation in the third embodiment of the present invention.

Then, if the microprocessor 5 confirms that a lock flag which is contained in the Read Data from the MOP IC 3 is zero (0), the flow proceeds to step S800 in FIG. 8A, or if the microprocessor 5 confirms that the lock flag which is contained in the Read Data from the MOP IC 3 is one (1), the flow proceeds to step S709. At this point, the lock flag is the same as explained in above first embodiment.

In step S709, the microprocessor 5 transmits a tuning data of a format which corresponds to the MOP IC 3 that is used for a tuner made by the A company with specifying a Write Slave Address which is set for the tuner made by the A company ("C2h" (FIG. 2B)). The tuning data has a designated frequency band, for example, VHF-Low (55 MHz-170 MHz) and has a designated frequency, for example, 900 MHz. By this arrangement, even when the MOP IC 3 which is used for the tuner made by the A company receives a tuning data, because it is impossible that frequency of a local signal which is output by the VHF-Low local oscillator 3d, is locked in a frequency that is a prescribed intermediate frequency higher than 900 MHz which is the designated frequency, the lock flag can be forcibly set to zero (0) as above described.

After step S709, the microprocessor 5 is held for 200 ms, then in step S710 the microprocessor 5 executes reading of the Read Data with specifying the Read Slave Address which is set for a tuner made by the A company ("C3h" (FIG. 2B)). Then in step S711, if the microprocessor 5 confirms that the lock flag which is contained in the Read Data from the MOP IC 3 is zero (0) (Y in step S711), the flow proceeds to step S800 in FIG. 8A, or if the microprocessor 5 confirms that the lock flag is one (1) (N in step S711), the flow returns to step S709.

In step S800 of FIG. 8A, the microprocessor 5 transmits the tuning data of the format which corresponds to the MOP IC 3 that is used for the tuner made by the A company in which frequency band and frequency that correspond to a prescribed channel are designated with specifying the Write Slave Address which is set for the tuner made by the A company ("C2h", (FIG. 2B)).

Then in step S801, the microprocessor 5 is held for 200 ms, then in step S802 the microprocessor 5 executes reading of the Read Data with specifying the Read Slave Address which is set for a tuner made by the A company ("C3h", (FIG. 2B)).

Then in step S803, if the microprocessor 5 confirms that the lock flag which is contained in the Read Data from the MOP IC 3 is one (1) (N in step S803), the microprocessor 5 judges that the tuner 2 is made by the A company, and in step S804 the microprocessor 5 makes the EEPROM 6 store a tuner discriminating information which designates a tuner made by the A company. Then in step S805, the microprocessor 5 transmits the tuning data of the format which corresponds to the MOP IC 3 that is used for the tuner made by the A company in which the frequency band and the frequency that correspond to a target channel are designated with specifying the Write Slave Address which is set for a tuner made by the A company ("C2h" (FIG. 2B)), then operation of the flow is terminated.

Figure 7B:
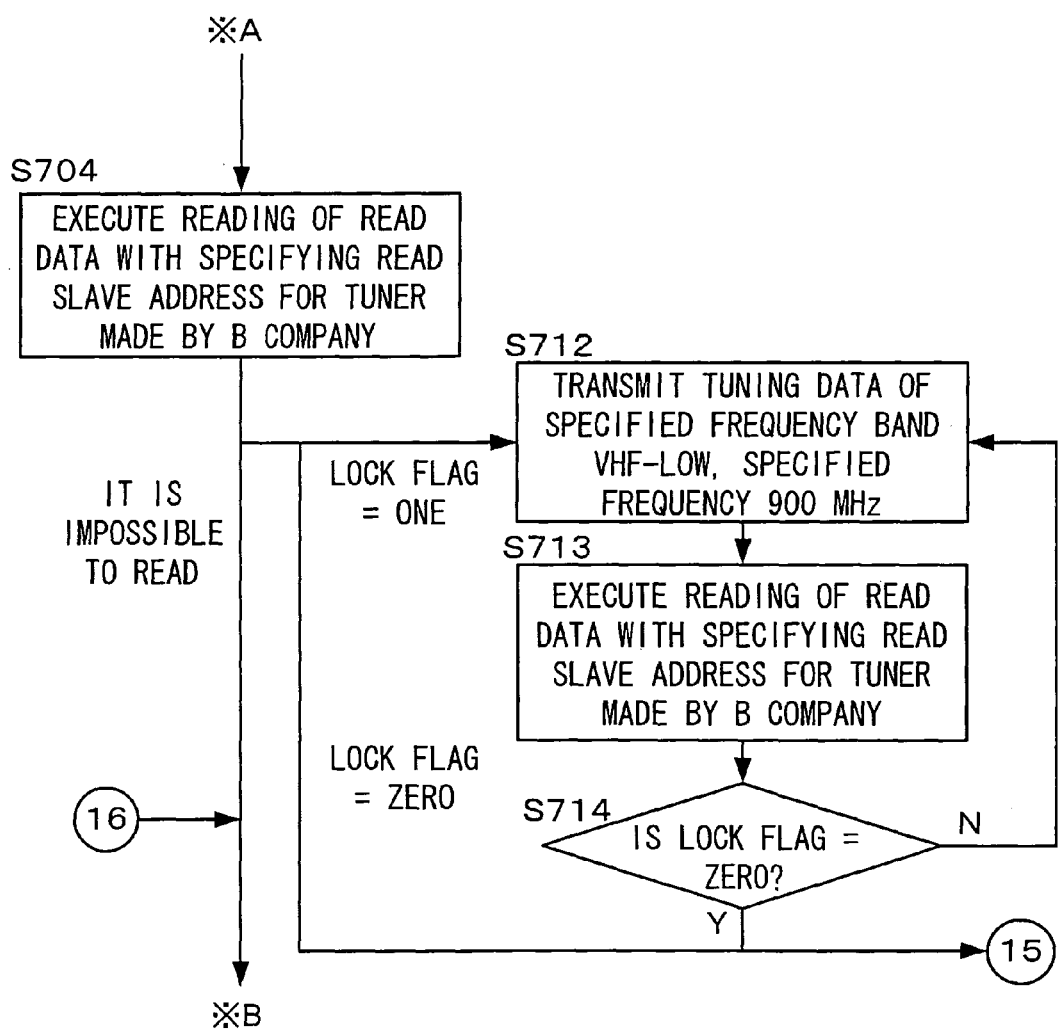
FIG. 7B is a flow chart which relates to the tuner discriminating operation in the third embodiment of the present invention.

In step S803, if the microprocessor 5 confirms that the lock flag which is contained in the Read Data from the MOP IC 3 is zero (0) (Y in step S803), or in step S703 (FIG. 7A) if the microprocessor 5 cannot perform reading of the Read Data, the flow proceeds to step S704 in FIG. 7B.

In step S704 the microprocessor 5 executes reading of the Read Data with specifying a Read Slave Address which is set for a tuner made by the B company ("C7h" (FIG. 2B)).

Figure 8B:
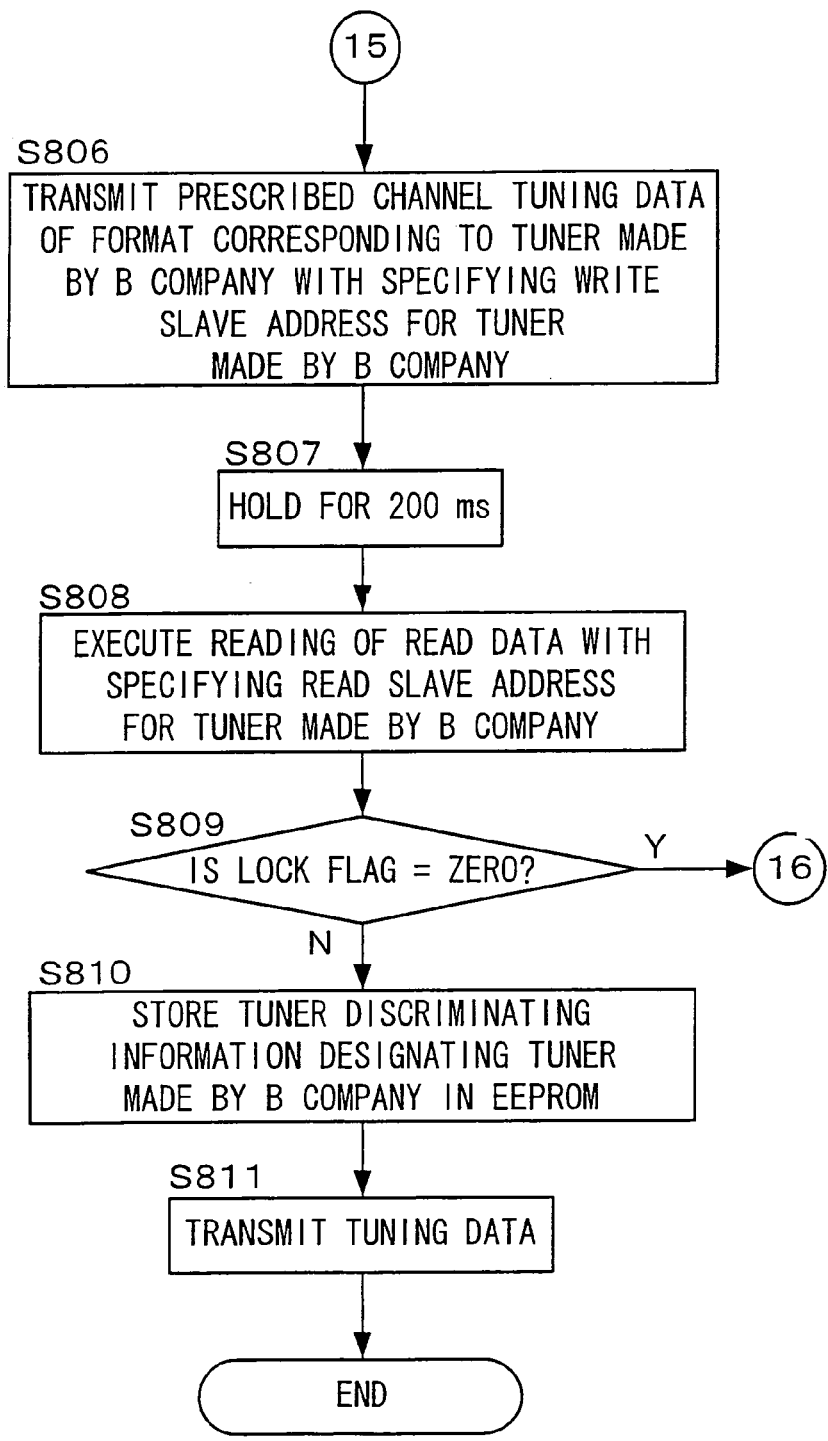
FIG. 8B is a flow chart which relates to the tuner discriminating operation in the third embodiment of the present invention.

Then, if the microprocessor 5 confirms that the lock flag which is contained in the Read Data from the MOP IC 3 is zero (0), the flow proceeds to step S806 in FIG. 8B, or if the microprocessor 5 confirms that the lock flag which is contained in the Read Data from the MOP IC 3 is one (1), the flow proceeds to step S712.

In step S712, the microprocessor 5 transmits a tuning data of the format which corresponds to the MOP IC 3 that is used for a tuner made by the B company with specifying a Write Slave Address which is set for the tuner made by the B company ("C6h" (FIG. 2B)). The tuning data has a designated frequency band, for example, VHF-Low (55 MHz-170 MHz) and has a designated frequency, for example, 900 MHz. By this arrangement, even when the MOP IC 3 which is used for the tuner made by the B company receives a tuning data, because it is impossible that frequency of a local signal which is output by the VHF-Low local oscillator 3d, is locked in a frequency that is a prescribed intermediate frequency higher than 900 MHz which is the designated frequency, the lock flag can be forcibly set to zero (0) as above described.

After step S712, the microprocessor 5 is held for 200 ms, then in step S713 the microprocessor 5 executes reading of the Read Data with specifying the Read Slave Address which is set for a tuner made by the B company ("C7h" (FIG. 2B)). Then in step S714, if the microprocessor 5 confirms that the lock flag which is contained in the Read Data from the MOP IC 3 is zero (0) (Y in step S714), the flow proceeds to step S806 in FIG. 8B, or if the microprocessor 5 confirms that the lock flag is one (1) (N in step S714), the flow returns to step S712.

In step S806 of FIG. 8B, the microprocessor 5 transmits the tuning data of the format which corresponds to the MOP IC 3 that is used for the tuner made by the B company in which the frequency band and the frequency that correspond to a prescribed channel are designated with specifying the Write Slave Address which is set for the tuner made by the B company ("C6h", (FIG. 2B)).

Then in step S807, the microprocessor 5 is held for 200 ms, then in step S808 the microprocessor 5 executes reading of the Read Data with specifying the Read Slave Address which is set for a tuner made by the B company ("C7h", (FIG. 2B)).

Then in step S809, if the microprocessor 5 confirms that the lock flag which is contained in the Read Data from the MOP IC 3 is one (1) (N in step S809), the microprocessor 5 judges that the tuner 2 is made by the B company, and in step S810 the microprocessor 5 makes the EEPROM 6 store the tuner discriminating information which designates a tuner made by the B company. Then in step S811, the microprocessor 5 transmits the tuning data of the format which corresponds to the MOP IC 3 that is used for the tuner made by the B company in which the frequency band and the frequency that correspond to the target channel are designated with specifying the Write Slave Address which is set for a tuner made by the B company ("C6h" (FIG. 2B)), then operation of the flow is terminated.

Figure 7C:
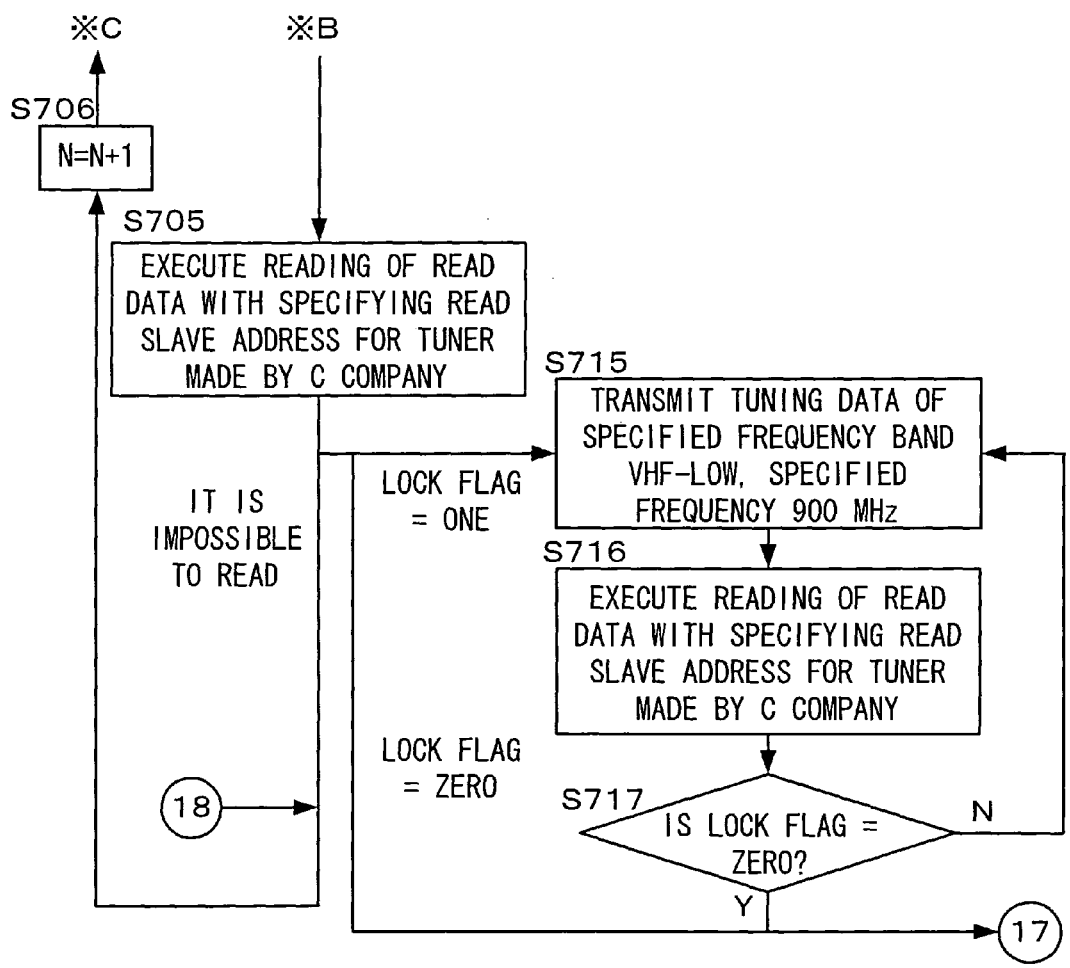
FIG. 7C is a flow chart which relates to the tuner discriminating operation in the third embodiment of the present invention.

In step S809, if the microprocessor 5 confirms that the lock flag which is contained in the Read Data from the MOP IC 3 is zero (0) (Y in step S809), or in step S704 (FIG. 7B) if the microprocessor 5 cannot perform reading of the Read Data, the flow proceeds to step S705 in FIG. 7C.

In step S705 the microprocessor 5 executes reading of the Read Data with specifying the Read Slave Address which is set for a tuner made by the C company ("C1h" (FIG. 2B)).

Figure 8C:
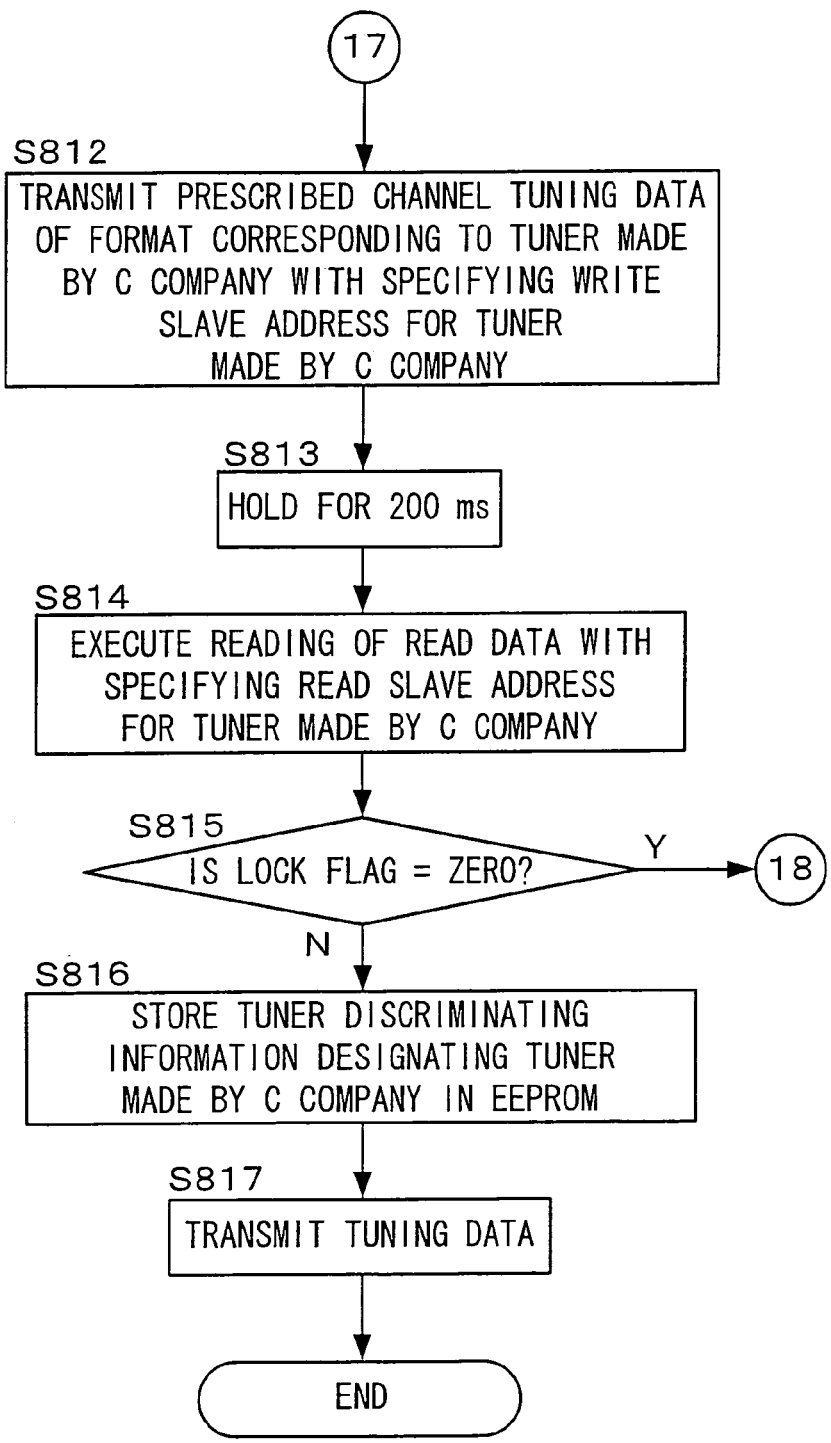
FIG. 8C is a flow chart which relates to the tuner discriminating operation in the third embodiment of the present invention.

Then, if the microprocessor 5 confirms that the lock flag which is contained in the Read Data from the MOP IC 3 is zero (0), the flow proceeds to step S812 in FIG. 8C, or if the microprocessor 5 confirms that the lock flag which is contained in the Read Data from the MOP IC 3 is one (1), the flow proceeds to step S715.

In step S715, the microprocessor 5 transmits the tuning data of the format which corresponds to the MOP IC 3 that is used for a tuner made by the C company with specifying a Write Slave Address which is set for the tuner made by the C company ("C0h" (FIG. 2B)). The tuning data has a designated frequency band, for example, VHF-Low (55 MHz-170 MHz) and has a designated frequency, for example, 900 MHz. By this arrangement, even when the MOP IC 3 which is used for the tuner made by the C company receives a tuning data, because it is impossible that frequency of a local signal which is output by the VHF-Low local oscillator 3d, is locked in a frequency that is a prescribed intermediate frequency higher than 900 MHz which is the designated frequency, the lock flag can be forcibly set to zero (0) as above described.

After step S715, the microprocessor 5 is held for 200 ms, then in step S716 the microprocessor 5 executes reading of the Read Data with specifying the Read Slave Address which is set for a tuner made by the C company ("C1h" (FIG. 2B)). Then in step S717, if the microprocessor 5 confirms that the lock flag which is contained in the Read Data from the MOP IC 3 is zero (0) (Y in step S717), the flow proceeds to step S812 in FIG. 8C, or if the microprocessor 5 confirms that the lock flag is one (1) (N in step S717), the flow returns to step S715.

In step S812 of FIG. 8C, the microprocessor 5 transmits the tuning data of a format which corresponds to the MOP IC 3 that is used for the tuner made by the C company in which the frequency band and the frequency that correspond to a prescribed channel are designated with specifying the Write Slave Address which is set for the tuner made by the C company ("C0h", (FIG. 2B)).

Then in step S813, the microprocessor 5 is held for 200 ms, then in step S814 the microprocessor 5 executes reading of the Read Data with specifying the Read Slave Address which is set for a tuner made by the C company ("C1h", (FIG. 2B)).

Then in step S815, if the microprocessor 5 confirms that the lock flag which is contained in the Read Data from the MOP IC 3 is one (1) (N in step S815), the microprocessor 5 judges that the tuner 2 is made by the C company, and in step S816 the microprocessor 5 makes the EEPROM 6 store the tuner discriminating information which designates a tuner made by the C company. Then in step S817, the microprocessor 5 transmits the tuning data of the format which corresponds to the MOP IC 3 that is used for the tuner made by the C company in which the frequency band and the frequency that correspond to the target channel are designated with specifying a Write Slave Address which is set for a tuner made by the C company ("C0h" (FIG. 2B)), then operation of the flow is terminated.

In step S815 if the microprocessor 5 confirms that the lock flag which is contained in the Read Data from the MOP IC 3 is zero (0) (Y in step S815), or in step S705 (FIG. 7C) if the microprocessor 5 cannot perform reading of the Read Data, the flow proceeds to step S706 (FIG. 7C). In step S706 the microprocessor 5 increments the variable N by one (1), then the flow returns to step S702 (FIG. 7A).

In step S702 if the microprocessor 5 judges that the variable N is three (3) (Y in step S702), the flow proceeds to step S708, and the microprocessor 5 makes the EEPROM 6 store the tuner discriminating information which designates the tuner is not discriminated, then the tuning data is not transmitted anymore.

Further, in step S700 when the microprocessor 5 confirms that the tuner discriminating information designates any one of tuners made by the A company, the B company, or the C company (N in step S700), the flow proceeds to step S707. In step S707 the microprocessor 5 transmits the tuning data of the format which corresponds to the tuner discrimination in which the frequency band and the frequency that correspond to the target channel are designated with specifying the Write Slave Address that corresponds to a tuner discrimination, then operation of the flow is terminated.

According to this third embodiment that is structured as above described, discrimination of tuner can be performed automatically, and similar effect as the first embodiment above described can be also obtained.

Fourth Embodiment

Next a fourth embodiment in accordance with the present invention will be described with reference to drawings. A structure of the digital broadcasting receiving apparatus according to the fourth embodiment is different from the digital broadcasting receiving apparatus of the first embodiment above described in a point that electrical potential to be applied to the AS terminal 3i is common regardless of the tuner manufacturers. Hereinafter, explanation will be given in an assumption that the common electrical potential to be applied is "Open", the Write Slave Address is set in "C2h", and the Read Slave Address is set in "C3h" for example.

Figure 9:
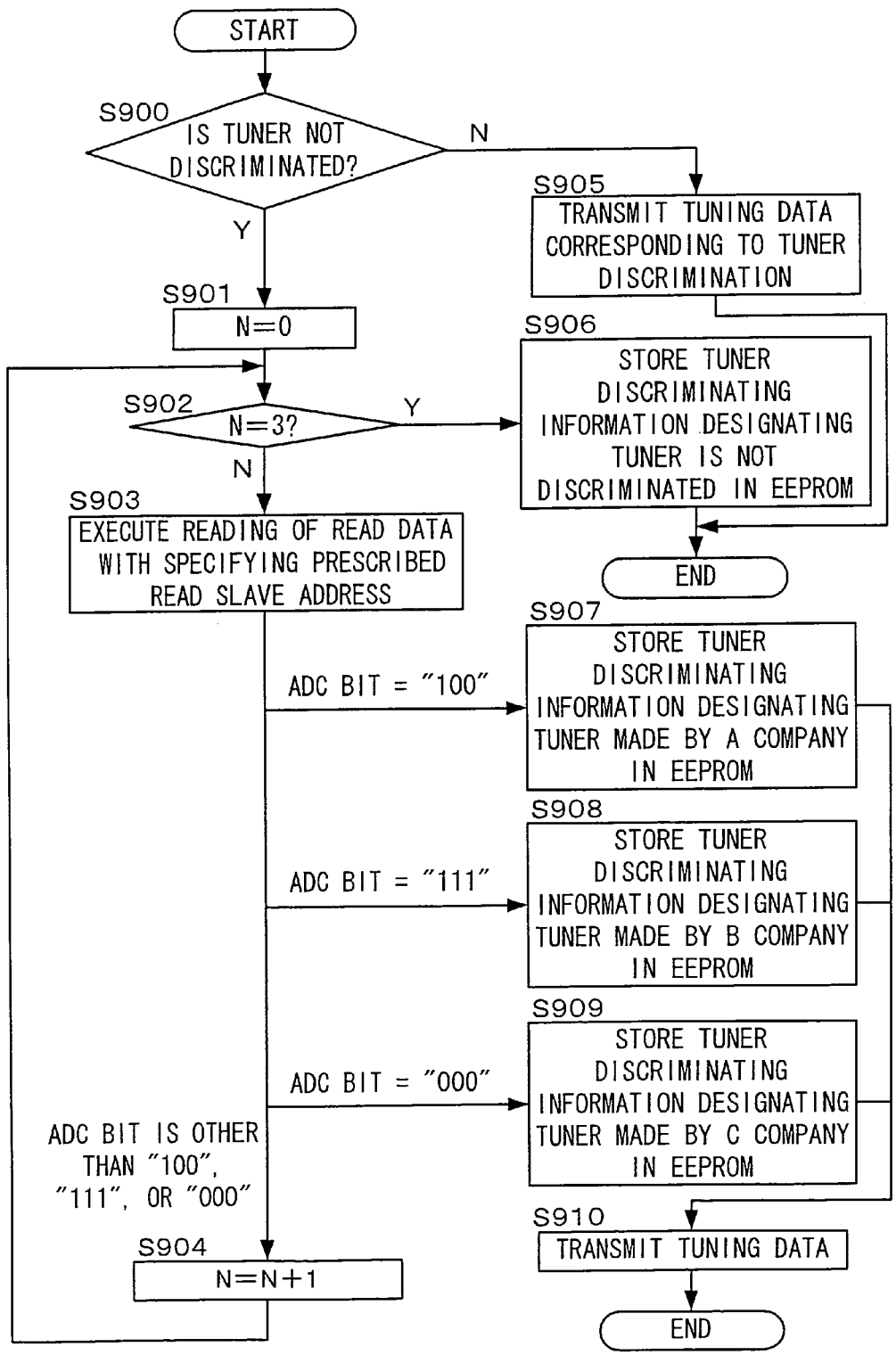
FIG. 9 is a flow chart which relates to a tuner discriminating operation in a fourth embodiment of the present invention.

When a power source of the digital broadcasting receiving apparatus according to the fourth embodiment is turned on, and the tuner driving software which is stored in the microprocessor 5 is executed, a flowchart shown in FIG. 9 is started.

First in step S900, the microprocessor 5 refers to a tuner discriminating information which is stored in the EEPROM 6. There are four kinds of the tuner discriminating information which designate a tuner made by the A company, a tuner made by the B company, a tuner made by the C company, and a tuner which is not discriminated, and when the digital broadcasting receiving apparatus is shipped from a factory the tuner discriminating information which designates a tuner which is not discriminated is stored in the EEPROM 6. If the microprocessor 5 confirms that the tuner discriminating information designates the tuner is not discriminated in step S900 (Y in step S900), the flow proceeds to step S 901.

In step S901, the microprocessor 5 makes a variable N zero (0). Then in step S902, the microprocessor 5 judges whether the variable N is three (3) or not, and if the variable N is not three (N in step S902), the flow proceeds to step S903.

In step S903 the microprocessor 5 executes reading of a Read Data with specifying a Read Slave Address "C3h".

Then, if the microprocessor 5 confirms that the ADC bit which is contained in the Read Data from the MOP IC 3 is "100" (it corresponds to a tuner made by the A company (FIG. 2A)), the flow proceeds to step S907 and the microprocessor 5 judges that the tuner 2 is made by the A company, then the microprocessor 5 makes the EEPROM 6 store the tuner discriminating information which designates a tuner made by the A company. Then in step S910, the microprocessor 5 transmits the tuning data of a format which corresponds to the MOP IC 3 that is used for the tuner made by the A company in which frequency band and frequency that correspond to a target channel are designated with specifying a Write Slave Address "C2h", then operation of the flow is terminated.

In step S903 the microprocessor 5 executes reading of the Read Data and if the microprocessor 5 confirms that the ADC bit which is contained in the Read Data from the MOP IC 3 is "111" (it corresponds to a tuner made by the B company (FIG. 2A)), the flow proceeds to step S908 and the microprocessor 5 judges that the tuner 2 is made by the B company, then the microprocessor 5 makes the EEPROM 6 store the tuner discriminating information which designates a tuner made by the B company. Then in step S910, the microprocessor 5 transmits the tuning data of the format which corresponds to the MOP IC 3 that is used for the tuner made by the B company in which the frequency band and the frequency that correspond to the target channel are designated with specifying the Write Slave Address "C2h", then operation of the flow is terminated.

In step S903 the microprocessor 5 executes reading of the Read Data and if the microprocessor 5 confirms that the ADC bit which is contained in the Read Data from the MOP IC 3 is "000" (it corresponds to a tuner made by the C company (FIG. 2A)), the flow proceeds to step S909 and the microprocessor 5 judges that the tuner 2 is made by the C company, then the microprocessor 5 makes the EEPROM 6 store the tuner discriminating information which designates a tuner made by the C company. Then in step S910, the microprocessor 5 transmits the tuning data of the format which corresponds to the MOP IC 3 that is used for the tuner made by the C company in which the frequency band and the frequency that correspond to the target channel are designated with specifying the Write Slave Address "C2h", then operation of the flow is terminated.

In step S903 the microprocessor 5 executes reading of the Read Data and if the microprocessor 5 confirms that the ADC bit which is contained in the Read Data from the MOP IC 3 is other than "100", "111", or "000", the flow proceeds to step S904 and the microprocessor 5 increments the variable N by one (1), then the flow returns to step S902.

In step S902 if the microprocessor 5 judges that the variable N is three (3) (Y in step S902), the flow proceeds to step S906, and the microprocessor 5 makes the EEPROM 6 store the tuner discriminating information which designates the tuner is not discriminated, then the tuning data is not transmitted anymore.

Further, in step S900 if the microprocessor 5 confirms that the tuner discriminating information designates any one of tuners made by the A company, the B company, or the C company (N in step S900), in step S905 the microprocessor 5 transmits the tuning data of the format which corresponds to the tuner discrimination in which the frequency band and the frequency that correspond to the target channel are designated with specifying the Write Slave Address "C2h", then operation of the flow is terminated.

According to this fourth embodiment that is structured as above described, discrimination of tuner can be performed automatically, and similar effect as the first embodiment above described can be also obtained.

Fifth Embodiment

Next a fifth embodiment in accordance with the present invention will be described with reference to drawings. A structure of the digital broadcasting receiving apparatus according to the fifth embodiment is different from the digital broadcasting receiving apparatus of the first embodiment above described in a point that electrical potential to be applied to the AS terminal 3*i* is common regardless of the tuner manufacturers. Hereinafter, explanation will be given in an assumption that the common electrical potential to be applied is "Open", the Write Slave Address is set in "C2h", and the Read Slave Address is set in "C3h" for example.

Figure 10:
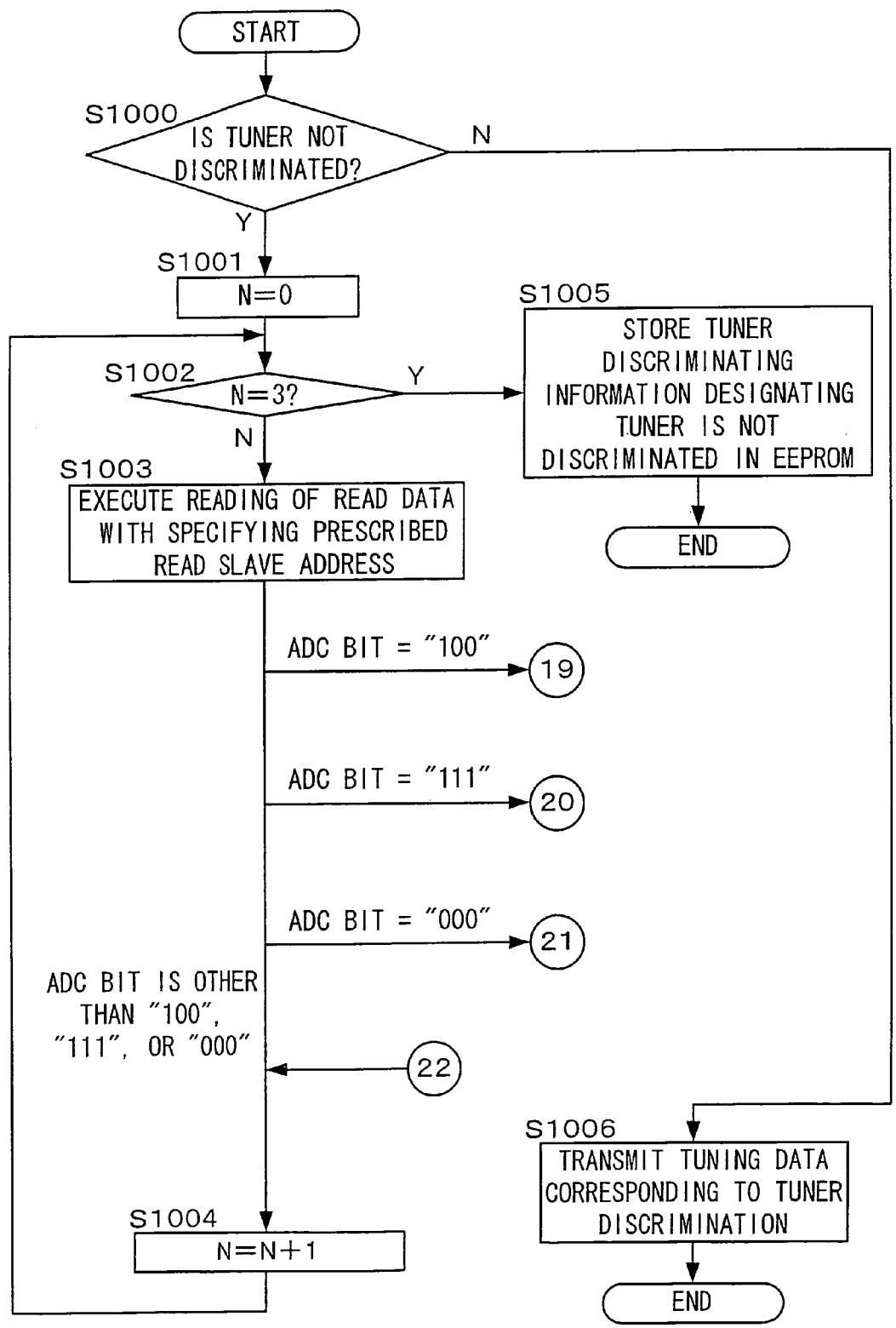
FIG. 10 is a flow chart which relates to a tuner discriminating operation in a fifth embodiment of the present invention.

When a power source of the digital broadcasting receiving apparatus according to the fifth embodiment is turned on, and the tuner driving software which is stored in the microprocessor 5 is executed, a flowchart shown in FIG. 10 is started.

First in step S1000, the microprocessor 5 refers to a tuner discriminating information which is stored in the EEPROM 6. There are four kinds of the tuner discriminating information which designate a tuner made by the A company, a tuner made by the B company, a tuner made by the C company, and a tuner which is not discriminated, and when the digital broadcasting receiving apparatus is shipped from a factory the tuner discriminating information which designates a tuner which is not discriminated is stored in the EEPROM 6. If the microprocessor 5 confirms that the tuner discriminating information designates the tuner is not discriminated in step S1000 (Y in step S1000), the flow proceeds to step S1001.

In step S1001, the microprocessor 5 makes a variable N zero (0). Then in step S1002, the microprocessor 5 judges whether the variable N is three (3) or not, and if the variable N is not three (N in step S1002), the flow proceeds to step S1003.

In step S1003 the microprocessor 5 executes reading of a Read Data with specifying a Read Slave Address "C3h".

Figure 11A:
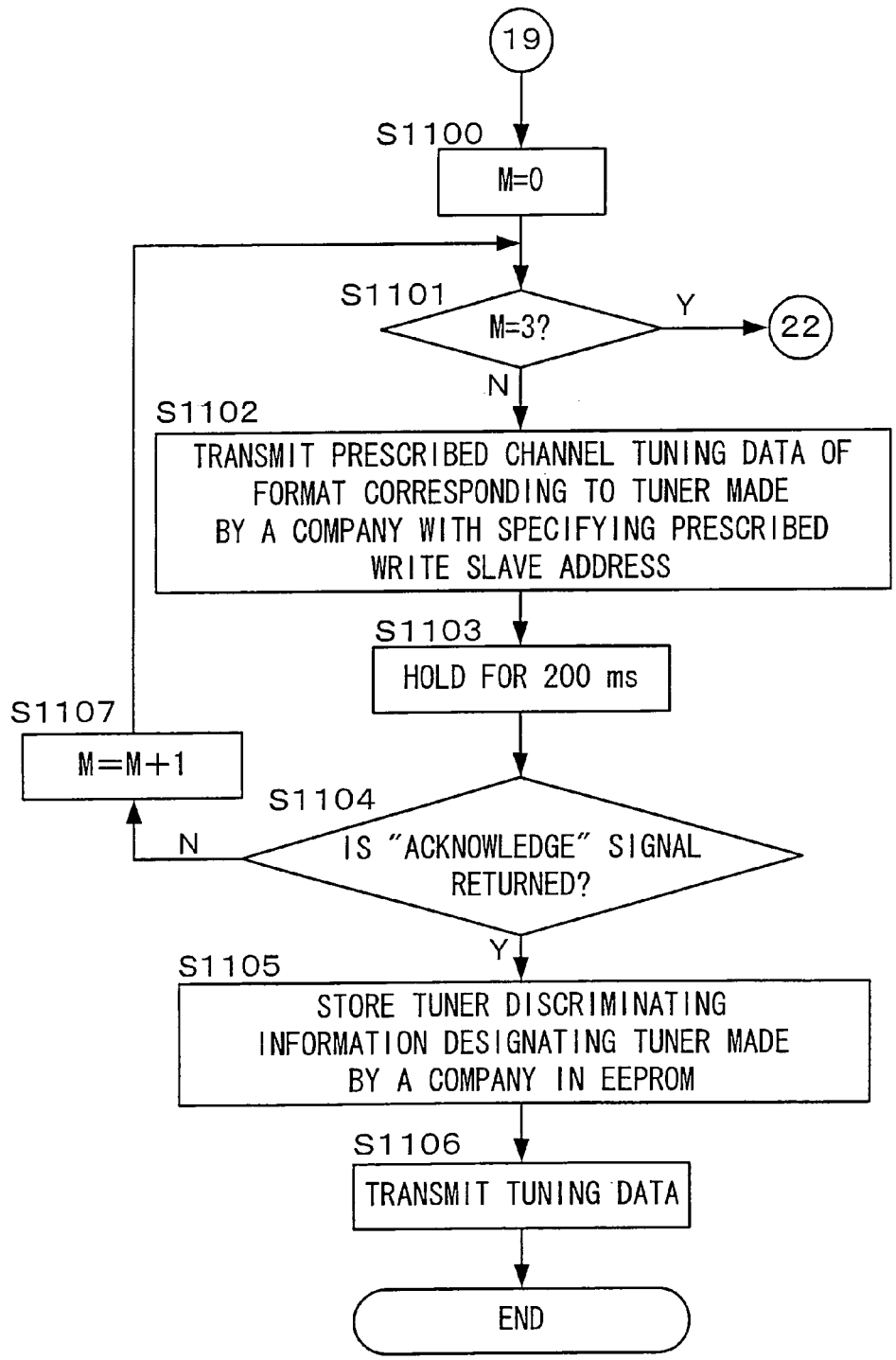
FIG. 11A is a flow chart which relates to the tuner discriminating operation in the fifth embodiment of the present invention.

Then, if the microprocessor 5 confirms that the ADC bit which is contained in the Read Data from the MOP IC 3 is "100" (it corresponds to a tuner made by the A company (FIG. 2A)), the flow proceeds to step S1100 in FIG. 11A.

In step S1100, the microprocessor 5 makes a variable M zero (0). Then, in step S1101, the microprocessor 5 judges whether the variable M is three (3) or not, and if the variable M is not three (N in step S1101), the flow proceeds to step S1102.

In step S1102, the microprocessor 5 transmits a tuning data of a format which corresponds to the MOP IC 3 that is used for a tuner made by the A company in which frequency band and frequency that correspond to a prescribed channel are designated with specifying a Write Slave Address "C2h".

Then in step S1103 the microprocessor 5 is held for 200 ms, then in step S1104, if the microprocessor 5 confirms that "Acknowledge" signal is returned from the MOP IC 3 (V in step S1104), the microprocessor 5 judges that the tuner 2 is made by the A company, and the flow proceeds to step S1105 the microprocessor 5 makes the EEPROM 6 store the tuner discriminating information which designates a tuner made by the A company. Then in step S1106, the microprocessor 5 transmits the tuning data of the format which corresponds to the MOP IC 3 that is used for the tuner made by the A company in which the frequency band and the frequency that correspond to a target channel are designated with specifying a Write Slave Address "C2h", then operation of the flow is terminated.

At this point in step S1104, if the microprocessor 5 cannot confirm that the "Acknowledge" signal is returned from the MOP IC 3 (N in step S1104), the flow proceeds to step S1107 and the microprocessor 5 increments the variable M by one (1), then the flow returns to step S1101.

In step S101 when the microprocessor 5 judges that the variable M is three (3) (Y in step S1101), the flow proceeds to step S1004 (FIG. 10).

Figure 11B:
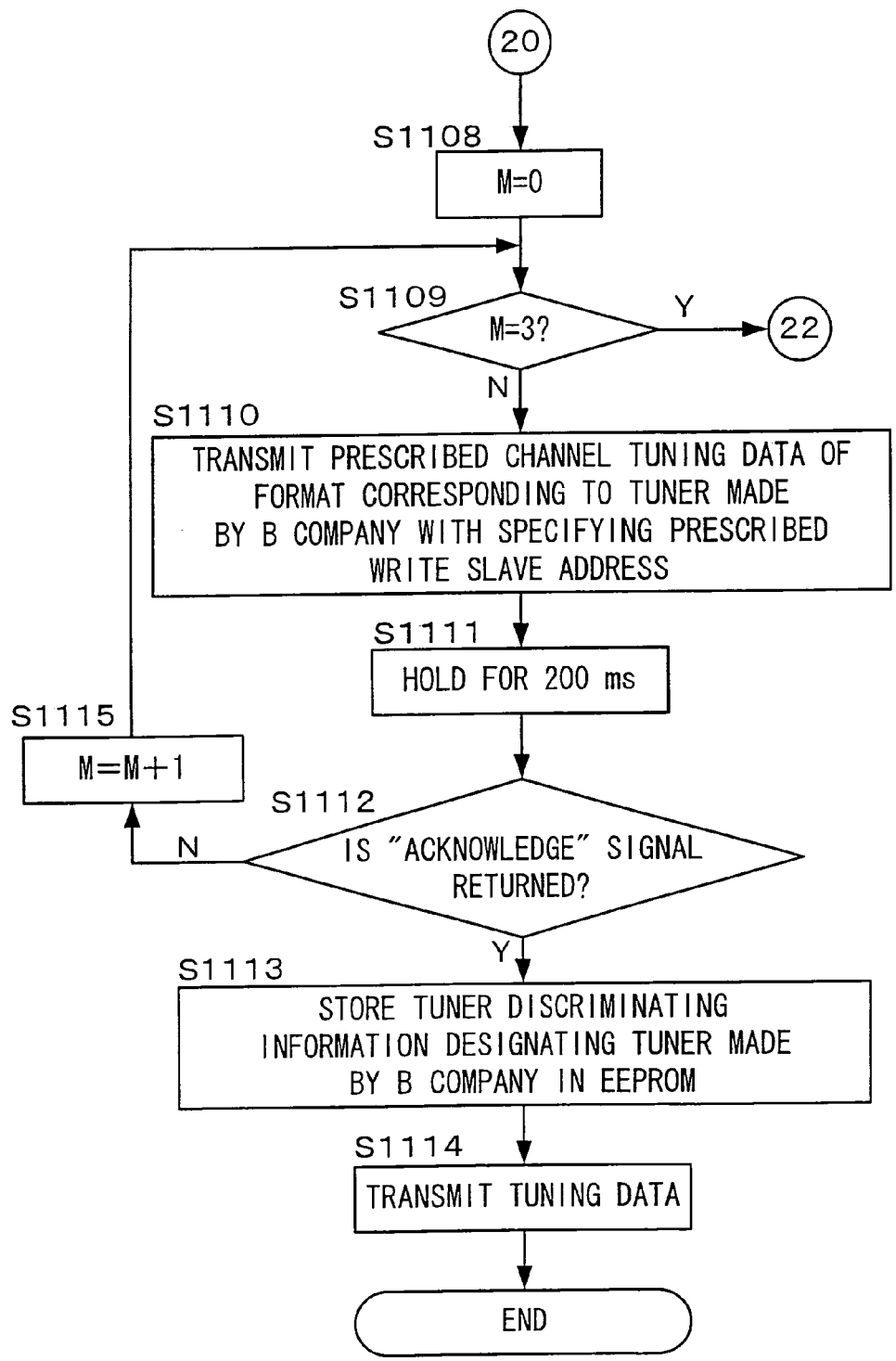
FIG. 11B is a flow chart which relates to the tuner discriminating operation in the fifth embodiment of the present invention.

In step S1003 the microprocessor 5 executes reading of the Read Data and if the microprocessor 5 confirms that the ADC bit which is contained in the Read Data from the MOP IC 3 is "111" (it corresponds to a tuner made by the B company (FIG. 2A)), the flow proceeds to step S1108 of FIG. 11B.

In step S1108, the microprocessor 5 makes the variable M zero (0). Then, in step S1109, the microprocessor 5 judges whether the variable M is three (3) or not, and if the variable M is not three (N in step S1109), the flow proceeds to step S1110.

In step S110, the microprocessor 5 transmits a tuning data of the format which corresponds to the MOP IC 3 that is used for a tuner made by the B company in which the frequency band and the frequency that correspond to a prescribed channel are designated with specifying a Write Slave Address "C2h".

Then in step S111 the microprocessor 5 is held for 200 ms, then in step S1112 if the microprocessor 5 confirms that the "Acknowledge" signal is returned from the MOP IC 3 (Y in step S1112), the microprocessor 5 judges that the tuner 2 is made by the B company, and the flow proceeds to step S1113 the microprocessor 5 makes the EEPROM 6 store the tuner discriminating information which designates a tuner made by the B company. Then in step S1114, the microprocessor 5 transmits the tuning data of the format which corresponds to the MOP IC 3 that is used for the tuner made by the B company in which the frequency band and the frequency that correspond to the target channel are designated with specifying a Write Slave Address "C2h", then operation of the flow is terminated.

At this point in step S1112, if the microprocessor 5 cannot confirm that the "Acknowledge" signal is returned from the MOP IC 3 (N in step S1112), the flow proceeds to step S1115 and the microprocessor 5 increments the variable M by one (1), then the flow returns to step S1109.

In step S109 when the microprocessor 5 judges that the variable M is three (3) (Y in step S1109), the flow proceeds to step S1004 (FIG. 10).

Figure 11C:
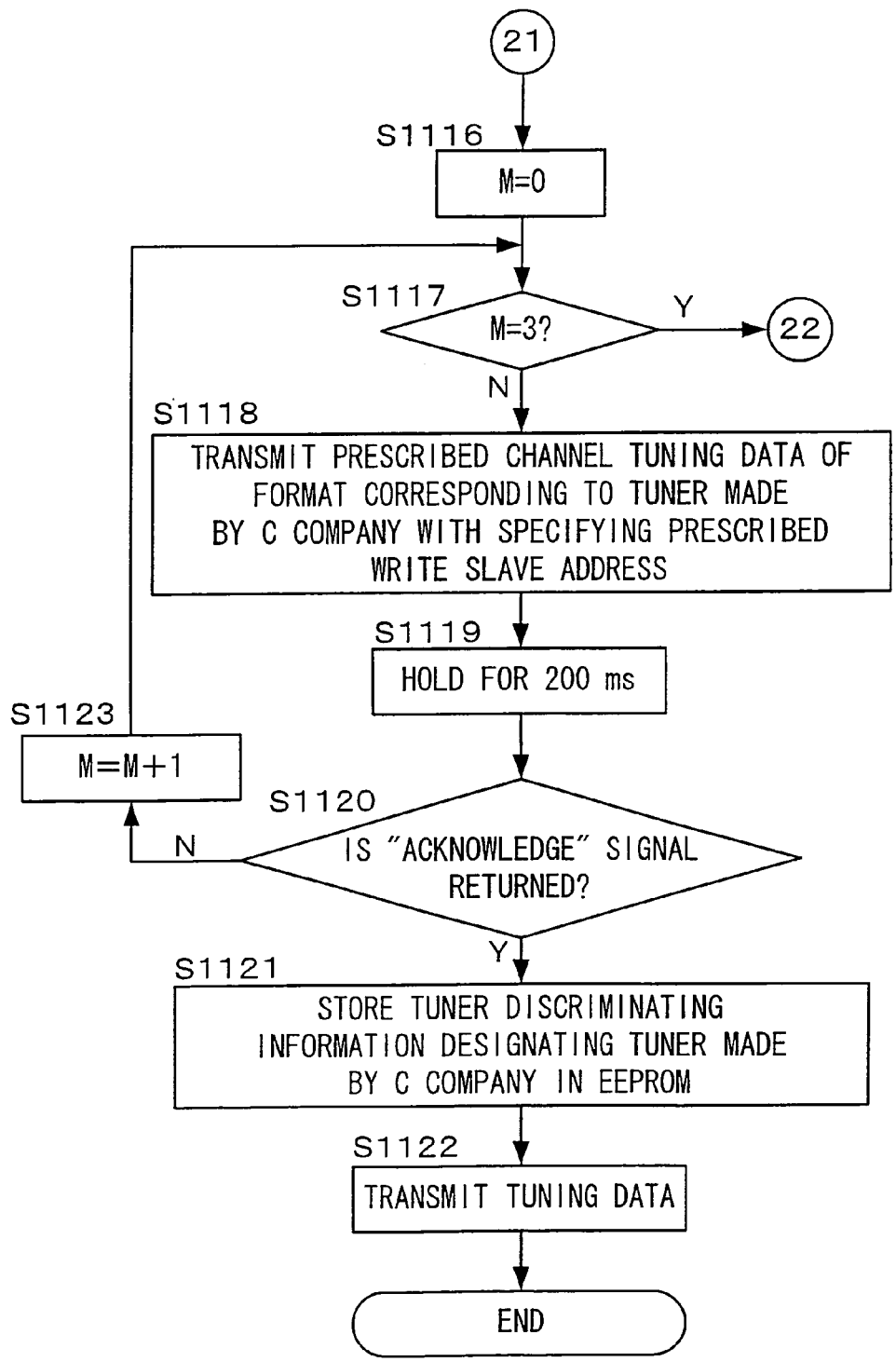
FIG. 11C is a flow chart which relates to the tuner discriminating operation in the fifth embodiment of the present invention.

In step S1003 the microprocessor 5 executes reading of the Read Data and if the microprocessor 5 confirms that the ADC bit which is contained in the Read Data from the MOP IC 3 is "000" (it corresponds to a tuner made by the C company (FIG. 2A)), the flow proceeds to step S1116 of FIG. 11C.

In step S1116, the microprocessor 5 makes the variable M zero (0). Then, in step S1117, the microprocessor 5 judges whether the variable M is three (3) or not, and if the variable M is not three (N in step S1117), the flow proceeds to step S1118.

In step S1118, the microprocessor 5 transmits a tuning data of the format which corresponds to the MOP IC 3 that is used for a tuner made by the C company in which the frequency band and the frequency that correspond to a prescribed channel are designated with specifying a Write Slave Address "C2h".

Then in step S1119 the microprocessor 5 is held for 200 ms, then in step S1120 if the microprocessor 5 confirms that the "Acknowledge" signal is returned from the MOP IC 3 (Y in step S1120), the microprocessor 5 judges that the tuner 2 is made by the C company, and the flow proceeds to step S1121 the microprocessor 5 makes the EEPROM 6 store the tuner discriminating information which designates a tuner made by the C company. Then in step S1122, the microprocessor 5 transmits the tuning data of the format which corresponds to the MOP IC 3 that is used for the tuner made by the C company in which the frequency band and the frequency that correspond to the target channel are designated with specifying a Write Slave Address "C2h", then operation of the flow is terminated.

At this point in step S1120, if the microprocessor 5 cannot confirm that the "Acknowledge" signal is returned from the MOP IC 3 (N in step S1120), the flow proceeds to step S1123 and the microprocessor 5 increments the variable M by one (1), then the flow returns to step S1117.

In step S1117 when the microprocessor 5 judges that the variable M is three (3) (Y in step S1117), the flow proceeds to step S1004 (FIG. 10).

In step S1003 (FIG. 10) the microprocessor 5 executes reading of the Read Data and if the microprocessor 5 confirms that the ADC bit which is contained in the Read Data from the MOP IC 3 is other than "100", "111", or "000", the flow proceeds to step S1004.

In step S1004 the microprocessor 5 increments the variable N by one (1), then the flow returns to step S1002.

In step S1002 if the microprocessor 5 judges that the variable N is three (3) (Y in step S1002), the flow proceeds to step S1005, and the microprocessor 5 makes the EEPROM 6 store the tuner discriminating information which designates the tuner is not discriminated, then the tuning data is not transmitted anymore.

Further, in step S1000 when the microprocessor 5 confirms that the tuner discriminating information designates any one of tuners made by the A company, the B company, or the C company (N in step S1000), in step S1006 the microprocessor 5 transmits the tuning data of the format which corresponds to the tuner discrimination in which the frequency band and the frequency that correspond to the target channel are designated with specifying the Write Slave Address "C2h", then operation of the flow is terminated.

According to this fifth embodiment that is structured as above described, discrimination of tuner can be performed automatically, and similar effect as the first embodiment above described can be also obtained.

What is claimed is:
1. A digital broadcasting receiving apparatus comprising:
a tuner which has a Mixer Oscillator PLL (MOP) IC; and
a microprocessor which is connected to the MOP IC so as to communicate with the MOP IC, wherein
a prescribed A/D converter (ADC) bit is set in an ADC bit which is contained in a Read Data stored in the MOP IC by applying a prescribed electrical potential to an ADC terminal which is included in the MOP IC, and a prescribed Write Slave Address and a prescribed Read Slave Address are set in the MOP IC by applying a prescribed electrical potential to an Address Select (AS) terminal which is included in the MOP IC;

when a power source of the apparatus is turned on, the microprocessor executes reading of the Read Data with specifying the prescribed Read Slave Address;

if the microprocessor cannot confirm that a flag which is contained in the Read Data from the MOP IC is an initial value that is set when the power source of the apparatus is turned on, and an ADC bit which is contained in the Read Data is the prescribed ADC bit, the microprocessor once again executes reading of the Read Data with specifying the prescribed Read Slave Address; then if the microprocessor confirms that the flag which is contained in the Read Data from the MOP IC is the initial value that is set when the power source of the apparatus is turned on, and the ADC bit which is contained in the Read Data is the prescribed ADC bit, the microprocessor transmits a tuning data of a format which corresponds to the MOP IC in which a prescribed channel is specified with specifying the prescribed Write Slave Address; then the microprocessor executes reading of the Read Data with specifying the prescribed Read Slave Address;

if the microprocessor cannot confirm that the flag which is contained in the Read Data from the MOP IC designates that a frequency of a local signal which is output from a local oscillator that is included in the MOP IC is locked in a frequency which is a prescribed intermediate frequency higher than a frequency that corresponds to the prescribed channel, and the ADC bit which is contained in the Read Data is the prescribed ADC bit, the microprocessor once again transmits the tuning data of the format which corresponds to the MOP IC in which the prescribed channel is specified with specifying the prescribed Write Slave Address, then the microprocessor executes reading of the Read Data with specifying the prescribed Read Slave Address; then if the microprocessor confirms that the flag which is contained in the Read Data from the MOP IC designates that a frequency of a local signal which is output from a local oscillator that is included in the MOP IC is locked in a frequency which is a prescribed intermediate frequency higher than a frequency that corresponds to the prescribed channel, and the ADC bit which is contained in the Read Data is the prescribed ADC bit, the microprocessor transmits the tuning data of the format which corresponds to the MOP IC in which target channel is specified with specifying the prescribed Write Slave Address.

2. A digital broadcasting receiving apparatus comprising:
a tuner which has a Mixer Oscillator PLL (MOP) IC; and
a microprocessor which is connected to the MOP IC so as to communicate with the MOP IC, wherein
a prescribed A/D converter (ADC) bit is set in an ADC bit which is contained in a Read Data stored in the MOP IC by applying a prescribed electrical potential to an ADC terminal which is included in the MOP IC, and a prescribed Write Slave Address and a prescribed Read Slave Address are set in the MOP IC by applying a prescribed electrical potential to an Address Select (AS) terminal which is included in the MOP IC;

when a power source of the apparatus is turned on, the microprocessor executes reading of the Read Data with specifying the prescribed Read Slave Address; and if the microprocessor confirms that the ADC bit which is contained in the Read Data from the MOP IC is the prescribed ADC bit, the microprocessor transmits a tuning data of a format which corresponds to the MOP IC in which target channel is specified with specifying the prescribed Write Slave Address.

3. The digital broadcasting receiving apparatus according to claim 2, wherein
the microprocessor executes reading of the Read Data with specifying the prescribed Read Slave Address; and
if the microprocessor cannot confirm that the ADC bit which is contained in the Read Data from the MOP IC is the prescribed ADC bit, the microprocessor once again executes reading of the Read Data with specifying the prescribed Read Slave Address.

4. A digital broadcasting receiving apparatus comprising:
a tuner which has a Mixer Oscillator PLL (MOP) IC; and
a microprocessor which is connected to the MOP IC so as to communicate with the MOP IC, wherein
a prescribed A/D converter (ADC) bit is set in an ADC bit which is contained in a Read Data stored in the MOP IC by applying a prescribed electrical potential to an ADC terminal which is included in the MOP IC, and a prescribed Write Slave Address and a prescribed Read Slave Address are set in the MOP IC by applying a prescribed electrical potential to an Address Select (AS) terminal which is included in the MOP IC;

when a power source of the apparatus is turned on, the microprocessor transmits a tuning data of a format which corresponds to the MOP IC in which a prescribed channel is specified with specifying the prescribed Write Slave Address; then the microprocessor executes reading of the Read Data with specifying the prescribed Read Slave Address; and if the microprocessor confirms that a flag which is contained in the Read Data from the MOP IC designates that a frequency of a local signal which is output from a local oscillator that is included in the MOP IC is locked in a frequency which is a prescribed intermediate frequency higher than a frequency that corresponds to the prescribed channel, the microprocessor transmits the tuning data of the format which corresponds to the MOP IC in which target channel is specified with specifying the prescribed Write Slave Address.

5. The digital broadcasting receiving apparatus according to claim 4, wherein
the microprocessor transmits a tuning data of the format which corresponds to the MOP IC in which the prescribed channel is specified with specifying the prescribed Write Slave Address; then
the microprocessor executes reading of the Read Data with specifying the prescribed Read Slave Address; and
if the microprocessor cannot confirm that the flag which is contained in the Read Data from the MOP IC designates that the frequency of the local signal which is output from the local oscillator that is included in the MOP IC is locked in the frequency which is the prescribed intermediate frequency higher than the frequency that corresponds to the prescribed channel, the microprocessor once again transmits the tuning data of the format which corresponds to the MOP IC in which the prescribed channel is specified with specifying the prescribed Write Slave Address.

6. The digital broadcasting receiving apparatus according to claim 4, wherein
the microprocessor executes reading of the Read Data with specifying the prescribed Read Slave Address; and
if the microprocessor confirms that the flag which is contained in the Read Data from the MOP IC is an initial value that is set when the power source of the apparatus is turned on, the microprocessor transmits a tuning data of the format which corresponds to the MOP IC in which the prescribed channel is specified with specifying the prescribed Write Slave Address.

7. The digital broadcasting receiving apparatus according to claim 4, wherein
the microprocessor executes reading of the Read Data with specifying the prescribed Read Slave Address;
if the microprocessor confirms that the flag which is contained in the Read Data from the MOP IC is not an initial value that is set when the power source of the apparatus is turned on, the microprocessor transmits a tuning data by which it is impossible for the frequency of the local signal which is output from the local oscillator that is included in the MOP IC to be locked in a frequency which is a prescribed intermediate frequency higher than a specified frequency; then
the microprocessor executes reading of the Read Data with specifying the prescribed Read Slave Address; and
if the microprocessor confirms that the flag which is contained in the Read Data from the MOP IC is the initial value, the microprocessor transmits a tuning data of the format which corresponds to the MOP IC in which the prescribed channel is specified with specifying the prescribed Write Slave Address.

8. A digital broadcasting receiving apparatus comprising:
a tuner which has a Mixer Oscillator PLL (MOP) IC; and
a microprocessor which is connected to the MOP IC so as to communicate with the MOP IC, wherein
a prescribed A/D converter (ADC) bit is set in an ADC bit which is contained in a Read Data stored in the MOP IC by applying a prescribed electrical potential to an ADC terminal which is included in the MOP IC, and a prescribed Write Slave Address and a prescribed Read Slave Address are set in the MOP IC by applying a prescribed electrical potential to an Address Select (AS) terminal which is included in the MOP IC;
when a power source of the apparatus is turned on, the microprocessor transmits a tuning data of a format which corresponds to the MOP IC in which a prescribed channel is specified with specifying the prescribed Write Slave Address; then
if the microprocessor confirms that "Acknowledge" signal is returned from the MOP IC, the microprocessor transmits the tuning data of the format which corresponds to the MOP IC in which a target channel is specified with specifying the prescribed Write Slave Address.

9. The digital broadcasting receiving apparatus according to claim 8, wherein
the microprocessor transmits the tuning data of the format which corresponds to the MOP IC in which the prescribed channel is specified with specifying the prescribed Write Slave Address; then
if the microprocessor cannot confirm that the "Acknowledge" signal is returned from the MOP IC, the microprocessor once again transmits the tuning data of the format which corresponds to the MOP IC in which the prescribed channel is specified with specifying the prescribed Write Slave Address.

* * * * *